US009164378B2

(12) United States Patent
Iihara et al.

(10) Patent No.: US 9,164,378 B2

(45) Date of Patent: Oct. 20, 2015

(54) DIRECT DRAWING-TYPE WATERLESS LITHOGRAPHIC PRINTING ORIGINAL PLATE

(75) Inventors: Akihiro Iihara, Otsu (JP); Yasunori Kuse, Otsu (JP); Yuta Shuto, Otsu (JP); Satoshi Yoshida, Otsu (JP); Kazuki Goto, Otsu (JP)

(73) Assignee: TORAY INDUSTRIES, INC., Tokyo (JP)

(*) Notice: Subject to any disclaimer, the term of this patent is extended or adjusted under 35 U.S.C. 154(b) by 0 days.

(21) Appl. No.: 13/823,611

(22) PCT Filed: Sep. 16, 2011

(86) PCT No.: PCT/JP2011/071252

§ 371 (c)(1), (2), (4) Date: Jun. 7, 2013

(87) PCT Pub. No.: WO2012/043282

PCT Pub. Date: Apr. 5, 2012

(65) Prior Publication Data

US 2013/0273473 A1 Oct. 17, 2013

(30) Foreign Application Priority Data

Sep. 30, 2010 (JP) ................................ 2010-221320
Nov. 29, 2010 (JP) ................................ 2010-264664
Nov. 29, 2010 (JP) ................................ 2010-264665

(51) Int. Cl.
*G03F 7/00* (2006.01)
*G03F 7/004* (2006.01)
*B41C 1/10* (2006.01)

(52) U.S. Cl.
CPC .............. *G03F 7/004* (2013.01); *B41C 1/1008* (2013.01); *B41C 2210/08* (2013.01)

(58) Field of Classification Search
CPC ............. C08L 7/00; B41M 1/00; B41M 1/06; B41M 3/00; G06F 1/00; G06F 2007/00
USPC .......... 430/270.1, 302; 101/450.1, 453, 463.1
See application file for complete search history.

(56) References Cited

U.S. PATENT DOCUMENTS

| | | | | |
|---|---|---|---|---|
| 6,410,208 | B1 * | 6/2002 | Teng | 430/302 |
| 2003/0013043 | A1 * | 1/2003 | Inno et al. | 430/302 |
| 2003/0228540 | A1 * | 12/2003 | Goto et al. | 430/272.1 |
| 2010/0075250 | A1 * | 3/2010 | Iihara et al. | 430/270.1 |
| 2011/0300486 | A1 * | 12/2011 | Iihara et al. | 430/309 |

FOREIGN PATENT DOCUMENTS

| | | | | |
|---|---|---|---|---|
| JP | 62-183464 | A | | 8/1987 |
| JP | 62-183464 | A | * | 8/1987 |
| JP | 7-261401 | A | | 10/1995 |
| JP | 2002-144693 | A | | 5/2002 |

OTHER PUBLICATIONS

International Search Report in PCT/JP2011/071252, dated Oct. 25, 2011.

* cited by examiner

*Primary Examiner* — Chanceity Robinson

(74) *Attorney, Agent, or Firm* — Birch Stewart Kolasch & Birch, LLP

(57) ABSTRACT

The objective is to provide a direct drawing-type waterless lithographic printing original plate which is highly sensitive and is not susceptible to formation of blisters, namely a direct drawing-type waterless lithographic printing original plate which has a wide latitude. Provided is a direct drawing-type waterless lithographic printing original plate which has at least a heat-sensitive layer and a silicone rubber layer on a substrate in this order. The direct drawing-type waterless lithographic printing original plate is characterized in that the heat-sensitive layer contains non-photosensitive particles and the average particle diameter of the non-photosensitive particles is not less than ½ of the average film thickness of a portion of the heat-sensitive layer where the non-photosensitive particles are not present.

7 Claims, No Drawings

DIRECT DRAWING-TYPE WATERLESS LITHOGRAPHIC PRINTING ORIGINAL PLATE

TECHNICAL FIELD

This invention relates to a directly imageable waterless lithographic printing plate precursor, particularly, a directly imageable waterless lithographic printing plate precursor that allows direct plate making by a laser beam.

BACKGROUND ART

Hitherto, various printing plates for performing lithographic printing by using a silicone rubber or fluorine resin as an ink repellent layer without using dampening water (hereinafter referred to as “waterless lithographic printing”) have been proposed. Waterless lithographic printing is a lithographic printing method in which an image area and a non-image area are made to be present on almost the same plane, and with an ink acceptable layer as the image area and with an ink repellent layer as the non-image area, the difference in ink acceptability is used for allowing the image area only to accept ink. Subsequently the ink is transferred onto a printing medium such as paper, to achieve printing. The lithographic printing method has a feature that printing can be performed without using dampening water.

As methods for exposing the waterless lithographic printing plate precursor, various methods are proposed. These methods can be roughly classified into methods of performing ultraviolet irradiation via an original film, and computer-to-plate (hereinafter referred to as CTP) methods in which the image is directly written from the text without using the original film. The CTP methods include a method of irradiating with a laser beam, a method of writing using a thermal head, a method of partially applying a voltage using pin electrodes, a method of forming an ink repellent layer or ink acceptable layer using ink-jet, and so on. Among these methods, the method of irradiating with a laser beam is more excellent than the other methods in view of resolution and plate making speed.

The method of irradiating with a laser beam can be classified into two types: a photon mode method using a photo reaction and a heat mode method in which photo thermal conversion is performed to cause a thermal reaction. In particular, the usefulness of the heat mode method grows higher owing to the advantage of allowing handling under daylight and the rapid progress of the semiconductor lasers used as light sources.

With regard to the directly imageable waterless lithographic printing plate precursors corresponding to the heat mode method, various proposals have been made hitherto. Above all, a directly imageable waterless lithographic printing plate precursor having bubbles in a heat sensitive layer is proposed as a directly imageable waterless lithographic printing plate precursor that allows plate making with low laser irradiation energy and is good in image reproducibility (for example, see patent document 1). Further, as a method for producing a directly imageable lithographic printing plate precursor that allows plate making with low laser irradiation energy and is good in image reproducibility, proposed is a method for producing a directly imageable waterless lithographic printing plate precursor, comprising a step of coating a heat sensitive layer composition solution containing an organic solvent with a solubility parameter of 17.0 $(MPa)^{1/2}$ or less and a step of drying the heat sensitive layer composition (for example, see patent document 2).

PRIOR ART DOCUMENTS

Patent Documents

Patent document 1: JP 2005-300586 A (claims)
Patent document 2: JP 2005-331924 A (claims)

SUMMARY OF THE INVENTION

Problem to be Solved by the Invention

The directly imageable waterless lithographic printing plate precursors obtained by the techniques described in patent documents 1 and 2 are highly sensitive and allow development by merely adding a physical force after exposure. However, in the case of a highly sensitive directly imageable waterless lithographic printing plate precursor, in the step of producing a waterless lithographic printing plate, a phenomenon called “blisters” in which the silicone rubber layer of the exposed area is separated occurs, and it can happen that the silicone rubber layer is transferred to the conveyor rollers in the exposure machine and the automatic processor, and that the silicone rubber layer transferred to the conveyor rollers is retransferred to the surface of the precursor to be processed subsequently, to cause exposure disturbances and development disturbances.

In this situation, the object of this invention is to solve the abovementioned problem of the prior art by providing a directly imageable waterless lithographic printing plate precursor that is highly sensitive and unlikely to cause blisters, that is, wide in latitude.

Means for Solving the Problem

This invention is a directly imageable waterless lithographic printing plate precursor having at least a heat sensitive layer and a silicone rubber layer on a substrate in this order, in which the heat sensitive layer contains non-photosensitive particles, and the average particle size of the non-photosensitive particles is not smaller than ½ time the average layer thickness of the heat sensitive layer in the portion where the non-photosensitive particles are not present.

Effects of the Invention

This invention can provide a directly imageable waterless lithographic printing plate precursor that is highly sensitive, excellent in anti-blister performance and wide in latitude.

MODES FOR CARRYING OUT THE INVENTION

The directly imageable waterless lithographic printing plate precursor of this invention has at least a heat sensitive layer and a silicone rubber layer on a substrate in this order, in which the heat sensitive layer contains non-photosensitive particles, and the average particle size of the non-photosensitive particles is not smaller than ½ time the average layer thickness of the heat sensitive layer in the portion where the non-photosensitive particles are not present. In this case, a waterless lithographic printing plate precursor refers to a lithographic printing plate precursor that allows printing without using dampening water, and a directly imageable waterless lithographic printing plate precursor refers to a waterless lithographic printing plate precursor that allows an image to be written directly from the text using a laser beam.

The directly imageable waterless lithographic printing plate precursor of this invention is explained below.

The directly imageable waterless lithographic printing plate precursor of this invention has at least a heat sensitive layer and a silicone rubber layer on a substrate in this order.

As the substrate, any of dimensionally stable and publicly known paper, metals, glass, films and the like that have been used as substrates of the conventional printing plates can be used. Examples of the substrate include paper, paper laminated with a plastic (polyethylene, polypropylene, or polystyrene, etc.), metal sheet of aluminum (including an aluminum alloy), zinc, copper, or the like, glass sheet of soda lime, quartz, or the like, silicon wafer, film of a plastic such as cellulose acetate, polyethylene terephthalate, polyethylene, polyester, polyamide, polyimide, polystyrene, polypropylene, polycarbonate, or polyvinyl acetal, paper or plastic film having any of the abovementioned metals laminated or vapor-deposited, etc. The plastic film can be transparent or opaque. In view of proofing capability, an opaque film is preferred.

Among these substrates, an aluminum sheet is especially preferred, since it is dimensionally very stable and inexpensive. Further, as a soft substrate for light printing, a polyethylene terephthalate film is especially preferred.

There is no particular limit to the thickness of the substrate, and it is only required to select a thickness suitable for the printing machine used for lithographic printing.

The heat sensitive layer preferably used in this invention is explained below. As the heat sensitive layer, a layer capable of being changed in physical properties by laser drawing and/or a layer lowered in the adhesive strength to the silicone rubber layer by laser drawing is preferred. For example, a layer obtained by coating a composition containing a polymer having active hydrogen, a crosslinking agent and a photo thermal conversion material or a composition containing a polymer having active hydrogen, an organic complex compound and a photo thermal conversion material, and drying (heating) can be used.

This invention is characterized in that the heat sensitive layer contains non-photosensitive particles, and that the average particle size of the non-photosensitive particles is not smaller than ½ time the average layer thickness of the heat sensitive layer in the portion where non-photosensitive particles are not present. The highly sensitive directly imageable waterless lithographic printing plate precursor as described in the aforementioned patent documents 1 and 2 can be developed by merely applying a physical force after exposure. Consequently, in the process for producing the waterless lithographic printing plate, a phenomenon called "blisters" in which the silicone rubber layer of the exposed area is separated occurs, and when the directly imageable waterless lithographic printing plate precursor is conveyed after exposure, the silicon rubber layer may be transferred to the conveyor rollers in the exposure machine and the automatic processor as the case may be. The silicone rubber layer transferred to the conveyor rollers is retransferred to the surface of the precursor to be processed subsequently, to cause exposure disturbances, development disturbances, etc. The phenomenon of blisters is more outstanding when the sensitivity of the directly imageable waterless lithographic printing plate precursor is higher and when the exposure value is larger. In the directly imageable waterless lithographic printing plate precursor, since the heat sensitive layer contains non-photosensitive particles as mentioned before, the heat sensitive layer is locally lowered in sensitivity, to keep the adhesive strength to the silicone rubber layer, and the phenomenon of blisters can be inhibited. That is, the anti-blister performance is enhanced. The average particle size of the non-photosensitive particles is not smaller than ½ time the average layer thickness of the heat sensitive layer in the portion where the non-photosensitive particles are not present, and preferred is ¾ time or larger. More preferred is 1 time or larger, and further more preferred are 5/4 times or larger. If the average particle size of the non-photosensitive particles is smaller than ½ time the average layer thickness of the heat sensitive layer in the portion wherein the non-photosensitive particles are not present, the effect of enhancing the anti-blister performance cannot be obtained as in the case where the non-photosensitive particles are not contained. On the other hand, from the viewpoint of inhibiting the scumming of the non-image area at the time of printing caused by the non-photosensitive particles, it is preferred that the average particle size of the non-photosensitive particles is not larger than the total of the average layer thickness of the silicone rubber layer and the average layer thickness of the heat sensitive layer in the portion where the non-photosensitive particles are not present.

In this invention, the particle size of a non-photosensitive particle refers to the diameter of an equivolume sphere on the assumption that the particle is a complete sphere. Further, the average particle size of the non-photosensitive particles refers to the number average value calculated from the multiple particles with the aforementioned particle diameters. The average particle size of the non-photosensitive particles contained in the heat sensitive layer can be obtained from the observation with a transmission electron microscope (TEM). In more detail, samples are prepared from a directly imageable waterless lithographic printing plate precursor by a continuous (ultrathin) section method and the heat sensitive layer is observed with a TEM at an accelerating voltage of 100 kV and at a magnification of 2000×. The particle sizes of 50 non-photosensitive particles selected at random on the basis of the three-dimensional information of horizontal cross sections are measured, and the number average value is calculated to obtain the average particle size. The methods for measuring the average layer thicknesses of the heat sensitive layer and the silicone rubber layer are described later.

Further, the non-photosensitive particles in this invention refer to such particles that do not absorb at least the light with a wavelength in a range from 700 to 1500 nm used for exposure, preferably the light with a wavelength in a range from 750 to 1100 nm at all or little (the chemical reactions and physical changes such as combustion, melting, decomposition, gasification and explosion of the particles per se and other components of the heat sensitive layer other than the particles, caused by the photo absorption of the particles do not occur), and are clearly different from the generally publicly known photo thermal conversion particles (carbon black and other pigments with photo thermal conversion capability) capable of absorbing light with a wavelength in a range of 700 to 1500 nm and converting the light into heat. The presence of the non-photosensitive particles contained in the heat sensitive layer can be morphologically observed by observing the vertical cross sections and horizontal cross sections of the heat sensitive layer using an analyzer such as a TEM.

With regard to the types of the non-photosensitive particles, both inorganic particles and organic particles, and further, inorganic-organic hybrid particles can exhibit the effect of enhancing the anti-blister performance of this invention. These two or more types of particles can also be contained.

Examples of the inorganic particles include non-photosensitive inorganic particles such as $SiO_2$, $Al_2O_3$, $TiO_2$, $SnO_2$, $Sb_2O_6$, $Fe_2O_3$, $ZrO_2$, $CeO_2$ and $Y_2O_3$. Examples of commercially available non-photosensitive inorganic particles include silica particles such as functional spherical silica HPS series (produced by Toagosei Co., Ltd.), “Seahostar” (registered trademark) KE series (produced by Nippon Shokubai Co., Ltd.), “Particle Size Standard Particles” 8000 series (produced by Thermo Fisher Scientific), “Admafine” series (produced by Admatechs Co., Ltd.), and “Hipresica” (registered trademark) series (produced by Ube Nitto Kasei Co., Ltd.), alumina particles such as “Alumina Spherical Fine Particles” series (produced by Nippon Steel & Sumikin Materials Co., Ltd. Micron Co.), “Admafine” series (produced by Admatechs Co., Ltd.), “Alumina” series (produced by Nippon Light Metal Co., Ltd.), and “Alumina Beads” CB series (produced by Showa Denko K.K.). Among them, silica particles are preferred.

Examples of the organic particles include non-photosensitive organic particles of polymers of (meth)acrylic acid, (meth)acrylic acid derivatives, styrene, vinyl acetate, acrylonitrile and olefins, copolymers thereof, polyesters, polyamides, latexes, polyurethane, phenol resin, benzoguanamine-melamine resin, polyethersulfone resin, silicone resin, cellulose, fluorine resin, poly(fluoromethyl methacrylate), etc. In the above, (meth)acrylic acid is a general term for acrylic acid and methacrylic acid. Among them, polymers of (meth)acrylic acid and/or (meth)acrylic acid derivatives and styrene, copolymers thereof and silicone resin are preferred. Examples of commercially available non-photosensitive organic particles include “Micromer” series (produced by Corefront Corporation), “Chemisnow” (registered trademark) MX series, “Chemisnow” MR series, “Chemisnow” MP series (respectively produced by Soken Chemical & Engineering Co., Ltd.), “TAFTIC” (registered trademark) (produced by Toyobo Co., Ltd.), “Crosslinked Particles” SX8703(A) series (produced by JSR Corporation), “Finesphere” (registered trademark) series (produced by Nippon Paint Co., Ltd.), “EPOSTER” (registered trademark) MA series, “EPOSTER” YS series (respectively produced by Nippon Shokubai Co., Ltd.), “Matsumoto Microsphere” (registered trademark) M series, “Matsumoto Microsphere” S series (respectively produced by Matsumoto Yushi-Seiyaku Co., Ltd.), “Glossdell” (registered trademark) series (produced by Mitsui Chemicals, Inc.), and “LIOSPHERE” (registered trademark) series (produced by Toyo Ink Co., Ltd.), etc. as polymers of (meth)acrylic acid and/or (meth)acrylic acid derivatives, “Chemisnow” SX series (produced by Soken Chemical & Engineering Co., Ltd.), “Crosslinked Particles” SX8705 (P) series (produced by JSR Corporation), “STADEX” (registered trademark) series (produced by JSR Corporation), “DYNOSPHERES” series (produced by JSR Corporation), “Finesphere” series (produced by Nippon Paint Co., Ltd.), “Particle Size Standard Particles” 2000, 3000, 4000, 5000 and 7000 series (Thermo Fisher Scientific), etc. as styrene polymers, “TAFTIC” series (produced by Toyobo Co., Ltd.), etc. as acrylonitrile polymers, “AMILAN” (registered trademark) series (produced by Toray Industries, Inc.), etc. as polyamides, “TORAYPEARL” (registered trademark) PPS series (produced by Toray Industries, Inc.), etc. as polyphenylene sulfide, “CSM Latex” series (produced by Sumitomo Seika Chemicals Co., Ltd.), “SEPOLEX” (registered trademark) IR100K series (produced by Sumitomo Seika Chemicals Co., Ltd.), “Nipol” (registered trademark) series (produced by Zeon Corporation), etc. as latexes, “MELTEX” (registered trademark) series (produced by Sanyo Chemical Industries, Ltd.), “Dymic Beads” (registered trademark) series (produced by Dainichiseika Color & Chemicals Mfg. Co., Ltd.), “ARTPEARL” (registered trademark) series (Negami Chemical Industrial Co., Ltd.), etc. as polyurethane, “BEL PEARL” (registered trademark) (produced by Air Water Inc.), etc. as phenol resin, “TORAYPEARL” EP series (produced by Toray Industries, Inc.), etc. as epoxy resin, “TORAYPEARL” PES series (produced by Toray Industries, Inc.), etc. as polyethersulfone resin, “Tospearl” (registered trademark) series (produced by Momentive Performance Materials), etc. as silicone resin, “FLO-THENE” (registered trademark) series, “FLO-THENE” UF series, “FLO-BEADS” (registered trademark) series (respectively produced by Sumitomo Seika Chemicals Co., Ltd.), “Sunfine” (registered trademark) series (produced by Asahi Kasei Corporation), etc. as polyethylene, “FLO-BRAIN” (registered trademark) series (produced by Sumitomo Seika Chemicals Co., Ltd.), etc. as polypropylene, “FLO-BACK” (registered trademark) series (produced by Sumitomo Seika Chemicals Co., Ltd.), etc. as ethylene-vinyl acetate copolymer, “FLO-BEADS” series (produced by Sumitomo Seika Chemicals Co., Ltd.), etc. as ethylene-acrylic acid copolymer, “AVICEL” series (produced by Asahi Kasei Corporation), “CELLULOBEADS” series (produced by Daito Kasei Kogyo Co., Ltd.), etc. as cellulose, “LUBRON” (registered trademark) series, “Polyflon” MPA series (produced by Daikin Industries, Ltd.), etc. as fluorine resin, “EPOSTER” (registered trademark) series (produced by Nippon Shokubai Co., Ltd.), etc. as benzoguanamine-formaldehyde condensation product, “EPOSTER” series and “EPOSTER” GP series (respectively produced by Nippon Shokubai Co., Ltd.), etc. as benzoguanamine-melamine-formaldehyde condensation product, “EPOSTER” series (produced by Nippon Shokubai Co., Ltd.), etc. as melamine-formaldehyde condensation product, etc.

Further, as organic particles, core/shell type non-photosensitive organic particles each having a core/shell structure comprising different organic components as the core and the shell can also be used. Examples of the core/shell type non-photosensitive organic particles include butadiene-alkyl methacrylate-styrene copolymer such as “Paraloid” EXL-2655 (produced by Kureha Corporation), acrylic acid ester-methacrylic acid ester copolymer such as “Staphyloid” AC-3355, “Staphyloid” TR-2105, “Staphyloid” TR-2102, “Staphyloid” TR-2122, “Staphyloid” IM-101, “Staphyloid” IM-203, “Staphyloid” IM-301, “Staphyloid IM-401 (respectively produced by Takeda Pharmaceutical Co., Ltd.), “Paraloid” EXL-2314 (produced by Kureha Corporation), “Paraloid” EXL-2611, “Paraloid” EXL-3387 (respectively produced by Rohm & Haas), “Zeon Acryl Resin” F-351 (produced by Zeon Corporation), acrylic acid ester-acrylonitrile-styrene copolymer such as “Staphyloid” IM-601 (produced by Takeda Pharmaceutical Co., Ltd.), etc.

Examples of the non-photosensitive inorganic-organic hybrid particles include “SOLIOSTAR” (registered trademark) series comprising silica-acryl (produced by Nippon Shokubai Co., Ltd.), “Torayceram” (registered trademark) Powder-ZP-4000 (produced by Toray Industries, Inc.) having zirconium oxide fine particles made to adhere to the surface layers of nylon particles, “Torayceram” Powder-BPS-2000 having sheet-like boron nitride made to adhere to the surface layers of crosslinked polystyrene particles (respectively produced by Toray Industries, Inc.), etc.

These non-photosensitive particles are usually dispersed in the heat sensitive layer composition solution when used, and therefore it is preferred that the non-photosensitive particles are excellent in the stability of dispersion in the heat sensitive layer composition solution and is unlikely to settle naturally. Among the aforementioned non-photosensitive particles, organic particles are generally lower in density than inorganic particles and are more preferred in view of the dispersion stability in the heat sensitive layer composition solution.

Further, it is preferred that the non-photosensitive particles are insoluble in the heat sensitive layer composition solution. In general, inorganic particles are unlikely to be dissolved in an organic solvent, but non-crosslinked organic particles may be dissolved in an organic solvent as the case may be. Consequently, in the case where organic particles are used, it is preferred to use organic particles each having a crosslinked structure. Examples of the materials of such non-photosensitive organic particles include polymers respectively having a crosslinked structure, of (meth)acrylic acid, (meth)acrylic acid derivatives, styrene, vinyl acetate, acrylonitrile and olefins, copolymers thereof respectively having a crosslinked structure, crosslinked polyesters, crosslinked polyamides, crosslinked latexes, crosslinked polyurethane, crosslinked phenol resin, crosslinked benzoguanamine-melamine resin, crosslinked polyethersulfone resin, crosslinked silicone resin, crosslinked cellulose, crosslinked fluorine resin, crosslinked poly(fluoromethyl methacrylate), etc. Among the aforementioned examples of the non-photosensitive organic particles, the non-photosensitive organic particles each having a crosslinked structure include “Chemisnow” MX series and “Chemisnow” MR series (respectively produced by Soken Chemical & Engineering Co., Ltd.), “TAFTIC” series (produced by Toyobo Co., Ltd.), “Crosslinked Particles” SX8703(A) series (produced by JSR Corporation), “EPOSTER” MA series (produced by Nippon Shokubai Co., Ltd.), “Matsumoto Microsphere” M series, “Matsumoto Microsphere” S series (respectively produced by Matsumoto Yushi-Seiyaku Co., Ltd.), “Glossdell” series (produced by Mitsui Chemicals, Inc.), “LIOSPHERE” series (produced by Toyo Ink Co., Ltd.), etc. as crosslinked polymers of (meth) acrylic acid and/or (meth)acrylic acid derivatives, “Chemisnow” SX series (produced by Soken Chemical & Engineering Co., Ltd.) and “Crosslinked Particles” SX8705(P) series (produced by JSR Corporation), etc. as crosslinked styrene polymer, “Dymic beads” series (produced by Dainichiseika Color & Chemicals Mfg. Co., Ltd.), “ARTPEARL” series (produced by Negami Chemical Industrial Co., Ltd.), etc. as crosslinked polyurethane, “BEL PEARL” series (produced by Air Water Inc.), etc. as crosslinked phenol resin, “TORAYPEARL” EP series (produced by Toray Industries, Inc.), etc. as crosslinked epoxy resin, “Tospearl” series (produced by Momentive Performance Materials), etc. as crosslinked silicone resin, “EPOSTER” series (produced by Nippon Shokubai Co., Ltd.), etc. as crosslinked benzoguanamine-formaldehyde condensation product, “EPOSTER” series and “EPOSTER” GP series (respectively produced by Nippon Shokubai Co., Ltd.), etc. as crosslinked benzoguanamine-melamine-formaldehyde condensation product, and “EPOSTER” series (produced by Nippon Shokubai Co., Ltd.), etc. as crosslinked melamine-formaldehyde condensation product. Among these non-photosensitive organic particles each having a crosslinked structure, it is preferred to use a crosslinked polymer of (meth)acrylic acid and/or (meth) acrylic acid derivative, crosslinked styrene polymer and crosslinked silicone resin.

Further, examples of the core/shell type non-photosensitive organic particles each having a crosslinked structure include butadiene-alkyl methacrylate-styrene copolymers such as “Paraloid” EXL-2655 (produced by Kureha Corporation), acrylic acid ester-methacrylic acid ester copolymers such as “Staphyloid” AC-3355, “Staphyloid” TR-2105, “Staphyloid” TR-2102, “Staphyloid” TR-2122, “Staphyloid” IM-101, “Staphyloid” IM-203, “Staphyloid” IM-301, “Staphyloid” IM-401 (respectively produced by Takeda Pharmaceutical Co., Ltd.), “Paraloid” EXL-2314 (produced by Kureha Corporation), “Paraloid” EXL-2611, “Paraloid” EXL-3387 (respectively produced by Rohm & Haas), and “Zeon Acrylic Resin” F-351 (produced by Zeon Corporation), and acrylic acid ester-acrylonitrile-styrene copolymer such as “Staphyloid” IM-601 (produced by Takeda Pharmaceutical Co., Ltd.), etc.

The shapes of the non-photosensitive particles can be spherical, semispherical, aspherical, hollow spherical, flat, lenticular, cubic, columnar, tabular, flaky, granular, rod-like, needle-like, fibrous, lumpy, tree branch-like, spongy, horny, thorny, roundish, etc. Irrespective of the shapes, the particles exhibit the effect of enhancing the anti-blister performance. Among the shapes, spherical particles do not have any directivity unlike the other shapes, and consequently especially preferred in view of stably exhibiting the effect of enhancing the anti-blister performance.

With regard to the particle sizes of the non-photosensitive particles, it is preferred to use particles distributed in a narrow range and almost mono-dispersed. As an index expressing the mono-dispersibility of particles, CV (coefficient of variation) value (CV value [%]=(Standard deviation/Average particle size)×100) is generally used, and in this invention, it is preferred that the CV value of the non-photosensitive particles is 15% or less. More preferred is 10% or less, and further more preferred is 5% or less. If the CV value of the non-photosensitive particles is 15% or less, the anti-blister performance can be more effectively enhanced even if the content of the non-photosensitive particles is small.

The CV value of non-photosensitive particles can be obtained from the aforementioned formula based on the average particle size and the standard deviation measured using a general laser diffraction/scattering particle size distribution analyzer (for example, “SALD (registered trademark)” series (produced by Shimadzu Corporation), etc. or a dynamic light scattering particle size distribution analyzer (for example, “LB” series (produced by Horiba, Ltd.), etc. In the case of spherical non-photosensitive particles, a digital camera connected with a transmitted light microscope (it is preferred to use an objective lens with a magnification of 1000× or more) is used to acquire an image (it is preferred that the overall magnification on the monitor is 2000× or more), and image analysis software (for example, “WinROOF” (produced by Mitani Corporation), etc.) is used to measure the average particle size and the standard deviation, which are then substituted into the aforementioned formula, to obtain the CV value. Further, the CV value of the non-photosensitive particles in the directly imageable waterless lithographic printing plate precursor can be obtained by calculating the number average particle size and the standard deviation from the information on the diameters of the equivolume spheres of 50 or more non-photosensitive particles obtained by the aforementioned method of measuring the particle sizes of the non-photosensitive particles, and substituting these values into the aforementioned formula. If the same non-photosensitive particles are used, the CV value measured by using the non-photosensitive particles is equal to that measured by using the directly imageable waterless lithographic printing plate precursor.

Further, for such purposes as enhancing the dispersibility of the non-photosensitive particles in the heat sensitive layer composition solution, enhancing the affinity with other components and securing crosslinking points, functional groups such as carboxyl groups, hydroxyl groups, epoxy groups, glycidyl groups, acryloyl groups, methacryloyl groups, vinyl groups or allyl groups may also be introduced into the surfaces of the non-photosensitive particles.

In the directly imageable waterless lithographic printing plate precursor of this invention, it is preferred that the occupying rate of the non-photosensitive particles at any horizontal plane of the heat sensitive layer is 40 area % or smaller based on the overall area (100 area %) of the heat sensitive layer, and more preferred is 30 area % or smaller. If the occupying rate of the non-photosensitive particles is 40 area % or smaller, the non-photosensitive particles are unlikely to overlap in the depth direction of the heat sensitive layer, and the exposure disturbances at the time of exposure and the scumming of the non-image area at the time of printing can be inhibited. On the other hand, from the viewpoint of enhancing the anti-blister performance, it is preferred that the occupying rate of the non-photosensitive particles at any horizontal plane is 0.5 area % or larger, and more preferred is 1.0 area % or larger. In this description, the occupying rate of the non-photosensitive particles at any horizontal plane of the heat sensitive layer means the rate (area %) of the non-photosensitive particles occupying any arbitrary horizontal cross section of the heat sensitive layer. The occupying rate of the non-photosensitive particles at any horizontal plane of the heat sensitive layer can be obtained by observation with a TEM. In more detail, samples are prepared from a directly imageable waterless lithographic printing plate precursor by a continuous (ultrathin) section method, and a horizontal cross section of the heat sensitive layer is observed with a TEM at an accelerating voltage of 100 kV and at a magnification of 2000×. By calculating the area occupied by the non-photosensitive particles in a unit area, the occupying rate (area %) of the non-photosensitive particles at any horizontal plane can be obtained.

In the directly imageable waterless lithographic printing plate precursor of this invention, in an embodiment showing a good effect, when a horizontal cross section of the heat sensitive layer is observed with a TEM, the layer thickness reduced regions caused by the non-photosensitive particles can be observed in the heat sensitive layer. It is estimated that the layer thickness reduced regions of the heat sensitive layer are locally low sensitized portions of the heat sensitive layer. In the case where the layer thickness reduced regions are defined as the regions where the layer thickness of the heat sensitive layer is reduced to 0.1 μm or less from the surface of the heat sensitive layer on the side facing the silicone rubber layer, if the projected images formed by projecting the aforementioned layer thickness reduced regions onto a plane parallel to the substrate surface are the horizontally projected images of the layer thickness reduced regions, then it is preferred that the area rate of the layer thickness reduced regions to the surface of the heat sensitive layer, calculated as the rate occupied by the total of the areas of the horizontally projected images of the aforementioned layer thickness reduced regions to the area of the horizontally projected image of the entire surface of the heat sensitive layer obtained by projecting the entire surface of the heat sensitive layer onto a plane parallel to the substrate surface, is 1 area % or larger. More preferred is 3 area % or larger.

Also in the directly imageable waterless lithographic printing plate precursor of this invention, in another embodiment showing a good effect, when a horizontal cross section of the heat sensitive layer is observed with a TEM, the heat sensitive layer inclined regions caused by the non-photosensitive particles can be observed in the heat sensitive layer. It is estimated that the heat sensitive layer inclined regions are locally low sensitized portions of the heat sensitive layer. In the case where the layer inclined regions are defined as at least partially continuous planar regions each having a gradient of 10 degrees or larger and configuring a swelling structure, if the projected images formed by projecting the inclined regions onto a plane parallel to the substrate surface are the horizontally projected images of the inclined regions, then it is preferred that the area rate of the inclined regions to the surface of the heat sensitive layer, calculated as the rate of the total of the areas of the horizontally projected images of the inclined regions to the area of the horizontally projected image of the entire surface of the heat sensitive layer formed by projecting the entire surface of the heat sensitive layer to a plane parallel to the substrate surface, is 1 area % or larger. More preferred is 3 wt % or larger. If an inclined region is, for example, the surface of a part of a semispherical swelling structure, the horizontally projected image is a circular ring formed by projecting the portion remaining after removing the region with gradients of smaller than 10 degrees near the vertex of the hemisphere from right above.

In this invention, the polymer having active hydrogen preferably used in the heat sensitive layer can be, for example, a polymer having a structural unit with active hydrogen such as —OH, —SH, $—NH_2$, —NH—, $—CO—NH_2$, —CO—NH—, —OC(═O)—NH—, —NH—CO—NH—, —CO—OH, —CS—OH, —CO—SH, —CS—SH, $—SO_3H$, $—PO_3H_2$, $—SO_2—NH_2$, $—SO_2—NH—$ or $—CO—CH_2—CO—$. Examples of the polymer having such a structural unit include homopolymers and copolymers of ethylenic unsaturated monomers each having active hydrogen (the comonomer can be another ethylenic unsaturated monomer having active hydrogen or ethylenic unsaturated monomer not containing active hydrogen) such as homopolymers and copolymers of monomers each containing a carboxyl group such as (meth) acrylic acid, homopolymers and copolymers of (meth)acrylic acid esters each containing a hydroxyl group such as hydroxyethyl (meth)acrylate or 2-hydroxypropyl (meth) acrylate, homopolymers and copolymers of N-alkyl(meth) acrylamides or (meth)acrylamide, homopolymers and copolymers of reaction products between amines and glycidyl (meth)acrylate or allyglycidyl, and homopolymers and copolymers of p-hydroxystyrene or vinyl alcohol, condensation products each having a structural unit with active hydrogen in the main chain of any of polyurethanes, polyureas, polyamides (nylon resins), epoxy resins, polyalkyleneimines, novolac resins, resol resins, cellulose derivatives, etc. Two or more of them can also be contained.

Among them, polymers having alcoholic hydroxyl groups, phenolic hydroxyls or carboxyl groups are preferred, and polymers having phenolic hydroxyl groups (homopolymer and copolymers of p-hydroxystyrene, novolac resins, resol resins, etc.) are more preferred. Novolac resins are further more preferred. The novolac resins include phenol novolac resin and cresol novolac resin.

It is preferred that the content of a polymer having active hydrogen is 20 wt % to 95 wt % based on the total solid content of the heat sensitive layer. A more preferred range is 50 wt % to 90 wt %.

It is also preferred that together with a polymer having active hydrogen, a film-formable polymer not having active hydrogen (referred to as the other polymer) is also contained. The other polymer can be a homopolymer or copolymer of a (meth)acrylic acid ester such as polymethyl (meth)acrylate or polybutyl (meth)acrylate, a homopolymer or copolymer of a styrene-based monomer such as polystyrene or α-methylstyrene, any of various synthetic rubbers such as isoprene or styrene-butadiene, a homopolymer of a vinyl ester such as polyvinyl acetate or a vinyl acetate-vinyl chloride copolymer or the like, any of various condensation polymers such as a polyester or polycarbonate.

It is preferred that the content of any of these other polymers is 50 wt % or less based on the total solid content of the heat sensitive layer. More preferred is 30 wt % or less, and further more preferred is 10 wt % or less.

The crosslinking agent can be a publicly known polyfunctional compound having crosslinkability. Examples of the crosslinking agent include a polyfunctional isocyanate, polyfunctional blocked isocyanate, polyfunctional epoxy compound, polyfunctional (meth)acrylate compound, polyfunctional aldehyde, polyfunctional mercapto compound, polyfunctional alkoxysilyl compound, polyfunctional amine compound, polyfunctional carboxylic acid, polyfunctional vinyl compound, polyfunctional diazonium salt, polyfunctional azide compound, hydrazine, etc.

The organic complex compound comprises a metal and an organic compound and functions as a crosslinking agent of the polymer having active hydrogen and/or a catalyst for thermosetting reaction. Even in the case where the organic complex compound functions as a crosslinking agent, the heat sensitive layer may also contain any of the aforementioned crosslinking agents.

The organic complex compound in this invention can be an organic complex salt in which an organic ligand bonds to a metal, an organic inorganic complex salt in which an organic ligand and an inorganic ligand bond to a metal, a metal alkoxide in which a metal and an organic molecule are covalently bonded to each other via oxygen, etc. Among them, a metal chelate compound in which a ligand has two or more donor atoms and forms a ring containing a metal atom can be preferably used in view of the stability of the organic complex compound per se, the stability of the heat sensitive layer composition solution, etc.

Preferred main metals forming the organic complex compound include Al (III), Ti (IV), Mn (II), Mn (III), Fe (II), Fe (III), Co (II), Co (III), Ni (II), Ni (IV), Cu (I), Cu (II) Zn (II), Ge, In, Sn (II), Sn (IV), Zr (IV) and Hf (IV). Al (III) is especially preferred, since the effect of enhancing the sensitivity is likely to be obtained, and Ti (IV) is especially preferred, since the resistance to the printing ink and the ink washing agent is likely to be exhibited.

Further, the ligand can be a compound having a ligand group with oxygen, nitrogen, sulfur or the like as a donor atom. Examples of the ligand group with oxygen as a donor atom include —OH (alcohol, enol, phenol), —COOH (carboxylic acid), >C═O (aldehyde, ketone, quinone), —O— (ether), —COOR (ester, R denotes an aliphatic or aromatic hydrocarbon), —N═O (nitroso compound), —$NO_2$ (nitro compound), >N—O (N-oxide), —$SO_3H$ (sulfonic acid), —$PO_3H_2$ (phosphorous acid), etc. Examples of the ligand group with nitrogen as a donor atom include —$NH_2$ (primary amine, amide, hydrazine), >NH (secondary amine, hydrazine), >N— (tertiary amine), —N═N— (azo compound, heterocyclic compound), ═N—OH (oxime), —$NO_2$ (nitro compound), —N═O (nitroso compound), >C═N— (Schiff base, heterocyclic compound), >C═NH (aldehyde, ketone imine, enamines), —NCS (isothiocyanate), etc. Examples of the ligand group with sulfur as a donor atom include —SH (thiol), —S—(thioether), >C═S (thioketone, thioamide), ═S—(heterocyclic compound), —C(═O)—SH, —C(═S)—OH, —C(═S)—SH (thiocarboxylic acid), —SCN (thiocyanate), etc.

Among the organic complex compounds formed from the abovementioned metals and ligands, preferably used compounds include complex compounds of metals such as Al (III), Ti (IV), Fe (II), Fe (III), Mn (III), Co (II), Co (III), Ni (II), Ni (IV), Cu (I), Cu (II), Zn (II), Ge, In, Sn (II), Sn (IV), Zr (IV) and Hf (IV) with β-diketones, amines, alcohols and carboxylic acids. Further, acetylacetone complexes, acetoacetic acid ester complexes, etc. of Al (III), Fe (II), Fe (III), Ti (IV) and Zr (IV) are especially preferred complex compounds.

Examples of these compounds include the following compounds. Aluminum tris(acetylacetonate), aluminum tris (ethylacetoacetate), aluminum tris(propylacetoacetate), aluminum tris(butylacetoacetate), aluminum tris (hexylacetoacetate), aluminum tris(nonylacetoacetate), aluminum tris(hexafluoropentadionate), aluminum tris(2,2,6,6-tetramethyl-3,5-heptanedionate), aluminum bis(ethylacetoacetate)-mono(acetylacetonate), aluminum bis(acetylacetonate)-mono(ethylacetoacetate), aluminum bis (propylacetoacetate)-mono(acetylacetonate), aluminum bis (butylacetoacetate)-mono(acetylacetonate), aluminum bis (hexylacetoacetate)-mono(acetylacetonate), aluminum bis (propylacetoacetate)-mono(ethylacetoacetate), aluminum bis(butylacetoacetate)-mono(ethylacetoacetate), aluminum bis(hexylacetoacetate)-mono(ethylacetoacetate), aluminum bis(nonylacetoacetate)-mono(ethylacetoacetate), aluminum dibutoxide-mono(acetylacetonate), aluminum diisopropoxide-mono(acetylacetonate), aluminum diisopropoxide-mono(ethylacetoacetate), aluminum-s-butoxide-bis(ethylacetoacetate), aluminum di-s-butoxide-mono (ethylacetoacetate), aluminum diisopropoxide-mono-9-octadecenylacetoacetate), etc.; titanium triisopropoxide-mono(allylacetoacetate), titanium diisopropoxide-bis (triethanolamine), titanium di-n-butoxide-bis (triethanolamine), titanium diisopropoxide-bis (acetylacetonate), titanium di-n-butoxide-bis (acetylacetonate), titanium diisopropoxide-bis(2,2,6,6-tetramethyl-3,5-heptanedionate), titanium diisopropoxide-bis(ethylacetoacetate), titanium di-n-butoxide-bis (ethylacetoacetate), titanium tri-n-butoxide-mono (ethylacetoacetate), titanium triisopropoxide-mono (methacryloxyethylacetoacetate), titanium oxide-bis (acetylacetonate), titanium tetra(2-ethyl-3-hydroxyhexyloxide), titanium dihydroxy-bis(lactate), titanium (ethyleneglycolate)-bis(dioctylphosphate), etc.; zirconium di-n-butoxide-bis(acetylacetonate), zirconium tetrakis(hexafluoropentanedionate), zirconium tetrakis(trifluoropentanedionate), zirconium tri-n-propoxide-mono (methacryloxyethylacetoacetate), zirconium tetrakis (acetylacetonate), zirconium tetrakis(2,2,6,6-tetramethyl-3,5-heptanedionate), triglycolate zirconic acid, trilactate zirconic acid, etc.; iron (III) acetylacetonate, dibenzoylmethane iron (II), tropolone iron, tristropolono-iron (III), hinokitiol iron, trishinokitiolo-iron (III), acetoacetic acid ester iron (III), iron (III) benzoylacetonate, iron (III) diphenylpropanedionate, iron (III) tetramethylheptanedionate, iron (III) trifluoropentanedionate, etc. Two or more of them can also be contained.

It is preferred that the content of the organic complex compound is 0.5 to 50 wt % based on the total solid content of the heat sensitive layer. A more preferred range is 3 to 30 wt %. If the content of the organic complex compound is 0.5 wt % or larger, the abovementioned effects can be further enhanced. On the other hand, if the content is kept at 50 wt % or smaller, the printing plate can maintain high printing durability.

There is no particular limit to the photothermal conversion material, if it can absorb the laser beam, and a pigment or dye capable of absorbing infrared radiation or near infrared radiation is preferred. Examples of the pigment include black pigments such as carbon black, carbon graphite, aniline black and cyanine black, phthalocyanine-based and naphthalocyanine-based green pigments, crystal water-containing inorganic compounds, metal powders of iron, copper, chromium, bismuth, magnesium, aluminum, titanium, zirconium, cobalt, vanadium, manganese, tungsten, etc., sulfides, hydroxides, silicates, sulfates, phosphates, diamine compound complexes, dithiol compound complexes, phenol thiol compound complexes, mercaptophenol compound complexes and the like of these metals.

Further, dyes capable of absorbing infrared radiation or near infrared radiation refer to dyes for electronics and recording, and cyanine-based dyes, azulenium-based dyes, squarylium-based dyes, croconium-based dyes, azo-based disperse dyes, bisazostilbene-based dyes, naphthoquinone-based dyes, anthraquinone-based dyes, perylene-based dyes, phthalocyanine-based dyes, naphthalocyanine metal complex-based dyes, polymethine-based dyes, dithiol nickel complex-based dyes, indoaniline metal complex dyes, intermolecular CT dyes, benzothiopyran-based spiropyran, nigrosine dyes, and the like respectively with the maximum absorption wavelength in a range from 700 nm to 1500 nm can be preferably used.

Among these dyes, those large in molecular extinction coefficient $\epsilon$ can be preferably used. Specifically, an $\epsilon$ value of $1\times10^4$ or larger is preferred, and more preferred is $1\times10^5$ or larger. If the $\epsilon$ value is $1\times10^4$ or larger, the initial sensitivity can be further enhanced.

Two or more of these photothermal conversion materials can also be contained. If two or more photothermal conversion materials different in absorption wavelength are contained, two or more laser beams different in transmission wavelength can be responded to.

Among them, in view of photothermal conversion rate, economy and handling properties, carbon black and dyes capable of absorbing infrared radiation or near infrared radiation are preferred.

It is preferred that the content of any of these photothermal conversion materials is 0.1 to 70 wt % based on the total solid content of the heat sensitive layer. A more preferred range is 0.5 to 40 wt %. If the content of the photothermal conversion material is kept at 0.1 wt % or larger, the sensitivity to the laser beam can be enhanced. On the other hand, if the content is kept at 70 wt % or smaller, the printing plate can maintain high printing durability.

Further, in the directly imageable waterless lithographic printing plate precursor of this invention, the heat sensitive layer may contain various additives as required. For example, in order to improve the coating properties, the heat sensitive layer may also contain a silicone-based surfactant, fluorine-based surfactant or the like. Furthermore, in order to strengthen the adhesion to the silicone rubber layer, the heat sensitive layer may also contain a silane coupling agent, titanium coupling agent or the like. The content of these additives is generally 0.1 to 30 wt % based on the total solid content of the heat sensitive layer, though depending on the purpose of use thereof.

Moreover, in the directly imageable lithographic printing plate precursor of this invention, the heat sensitive layer may also contain bubbles for the purpose of enhancing the sensitivity. The method for forming bubbles in the heat sensitive layer can be, for example, the method described in JP2005-300586A or JP2005-331924A.

Further, for the purposes of enhancing the sensitivity immediately after production of the printing plate precursor and maintaining high sensitivity also after lapse of time, the directly imageable waterless lithographic printing plate precursor of this invention may have liquid globules in the heat sensitive layer. It is preferred that the heat sensitive layer has liquid globules containing a liquid having a boiling point in a range from 210 to 270° C. With this measure, a directly imageable waterless lithographic printing plate precursor with high sensitivity maintained for a long period of time can be obtained. That is, if the liquid globules contain a liquid having a boiling point of 210° C. or higher, the form as liquid globules can be easily maintained for a long period of time, and high sensitivity can be maintained for a long period of time. On the other hand, if the liquid globules contain a liquid having a boiling point of 270° C. or lower, the initial sensitivity can be further enhanced, and in addition, the bleed-out of the liquid onto the surface of the heat sensitive layer and the peeling of the silicone rubber layer at the time of development can be inhibited. The directly imageable waterless lithographic printing plate precursor having such liquid globules in the heat sensitive layer is high in the initial sensitivity and in the sensitivity after lapse of time, and consequently tends to cause blisters. This invention exhibits an especially high effect for the precursor with such high sensitivity.

Meanwhile, in this invention, the boiling point of the liquid refers to the boiling point at atmospheric pressure. Further, in the case where there are multiple boiling points as in the case where the liquid globules contain two or more liquids, it is preferred that the rate of the liquid having a boiling point in a range from 210 to 270° C. is 60 wt % or larger. More preferred is 80 wt % or larger, and further more preferred is 90 wt % or larger. Still further more preferred is 100 wt %.

The liquid contained in the liquid globules can be identified by collecting the gas generated by heating and analyzing the gas composition.

Further, it is preferred that the solubility parameter of the liquid contained in the liquid globules is 17.0 $(MPa)^{1/2}$ or less. More preferred is 16.5 $(MPa)^{1/2}$ or less. A liquid with a solubility parameter of 17.0 $(MPa)^{1/2}$ or less is low in the compatibility with the aforementioned polymer, and consequently the solubility of the polymer in the liquid and/or the solubility of the liquid in the polymer is likely to decline. Thus, the liquid can be easily made to be present in the heat sensitive layer (in the polymer capable of forming a film) as liquid globules.

In this invention, the solubility parameter refers to the solubility parameter of Hildebrand, being the quantity $\delta$ defined by $\delta=(\Delta H/V)^{1/2}$, where $\Delta H$ denotes the molar evaporation heat of the liquid and V denotes the molar volume. As the unit of the solubility parameter, $(MPa)^{1/2}$ is used. As the unit of the solubility parameter, $(cal\cdot cm^{-3})^{1/2}$ is also often used, and between both the units, there is a relationship of $\delta(MPa)^{1/2}=2.0455\times\delta(cal\cdot cm^{-3})^{1/2}$. Specifically, a solubility parameter of 17.0 $(MPa)^{1/2}$ equals to 8.3 $(cal\cdot cm^{-3})^{1/2}$. The liquid with a solubility parameter of 17.0 $(MPa)^{1/2}$ or less can be an aliphatic hydrocarbon, alicyclic hydrocarbon, alkylene oxide dialkyl ether or the like, though not limited to them. In the light of economy and safety, an aliphatic saturated hydrocarbon is preferred.

The solubility parameter of the liquid contained in the liquid globules can also be confirmed as a literature value by analyzing the gas composition of the gas generated by heating and identifying the structure.

Examples of the liquid having a boiling point in a range from 210 to 270° C. and a solubility parameter of 17.0 $(MPa)^{1/2}$ or less include straight-chain, branched or cyclic hydrocarbons with 12 to 18 carbon atoms, alkylene glycol dialkyl ethers such as diethylene glycol butylmethyl ether (boiling point 212° C., solubility parameter 16.0 $(MPa)^{1/2}$), diethylene glycol dibutyl ether (boiling point 256° C., solubility parameter 15.8 $(MPa)^{1/2}$), triethylene glycol dimethyl ether (boiling point 216° C., solubility parameter 16.2 $(MPa)^{1/2}$), triethylene glycol butylmethyl ether (boiling point 261° C., solubility parameter 16.2 $(MPa)^{1/2}$), and tripropylene glycol dimethyl ether (boiling point 215° C., solubility parameter 15.1 $(MPa)^{1/2}$), etc. Two or more of them can also be contained.

From the viewpoint of enhancing the initial sensitivity and the sensitivity after lapse of time, it is preferred that at least one liquid globule is present in the area irradiated with a laser beam scanned in the exposure step when a waterless lithographic printing plate is produced. The irradiation area of a laser beam of a general exposure machine is approx. 100 $\mu m^2$ (a square of approx. 10 μm per side).

The number of liquid globules contained in the heat sensitive layer in the portion where the non-photosensitive particles are not present can be obtained by observation with a TEM. In more detail, samples are prepared from a directly imageable waterless lithographic printing plate precursor by a continuous (ultrathin) section method and the heat sensitive layer is observed with a TEM at an accelerating voltage of 100 kV and at a magnification of 8000×. On the basis of the three-dimensional information of horizontal cross sections, the total number of liquid globules (diameter 0.01 μm or larger) in the depth direction of 1 $\mu m^2$ (1 μm long×1 μm wide) of the horizontal cross section of the heat sensitive layer in the portion where the non-photosensitive particles are not present can be counted to obtain the number of liquid globules.

The spatial distribution of the liquid globules in the heat sensitive layer may be uniform or may be modulated in the depth direction. From the viewpoint of enhancing the initial sensitivity and the sensitivity after lapse of time, in 0.5 $\mu m^3$ (1 μm long×1 μM wide×0.5 μm deep) (depth from the interface with the silicone rubber layer) of the heat sensitive layer in the portion where non-photosensitive particles are not present in the range from the interface with the silicone rubber layer to a depth of 0.5 μm, it is preferred that the number of liquid globules with a diameter of 0.01 μm or larger is 2 or more, and a more preferred number is 20 globules or more.

It is preferred that the diameter of each liquid globule is 0.01 μm or larger. More preferred is 0.05 μm or larger, and further more preferred is 0.1 μm or larger. On the other hand, preferred is 1 μm or smaller. More preferred is 0.5 μm or smaller, and further more preferred is 0.3 μm or smaller. It is preferred that the liquid globules with diameters in the aforementioned range account for 50 vol % or more of all the liquid globules. More preferred is 80 vol % or more, and further more preferred is 90 vol % or more. It is preferred that the average diameter of liquid globules is 0.1 to 1 μm. A more preferred range is 0.1 to 0.3 μm, and further more preferred is 0.25 μm or smaller. If the size of the liquid globules is in the abovementioned range, the initial sensitivity and the sensitivity after lapse of time are further enhanced.

In this invention, the diameter of a liquid globule refers to the diameter of an equivolume sphere on the assumption that the liquid globule is a complete sphere. Further, the average diameter of liquid globules refers to the number average value calculated from multiple liquid globules with the aforementioned diameters. The average diameter of the liquid globules contained in the heat sensitive layer in the portion where the non-photosensitive particles are not present can be obtained by observation with a TEM. In more detail, the average diameter can be obtained by preparing samples from a directly imageable waterless lithographic printing plate precursor by a continuous (ultrathin) section method, observing the heat sensitive layer with a TEM at an accelerating voltage of 100 kV and at a magnification of 8000×, measuring the diameters of 50 liquid globules selected at random on the basis of the three-dimensional information of the horizontal cross sections, and calculating the number average value.

It is preferred that the content of the liquid globules in the heat sensitive layer is 0.1 vol % or larger based on the volume of the heat sensitive layer in the portion where the non-photosensitive particles are not present. More preferred is 1 vol % or larger, and further more preferred is 5 vol % or larger. On the other hand, from the viewpoints of solvent resistance and printing durability, 50 vol % or smaller is preferred. More preferred is 40 vol % or smaller, and further more preferred is 20 vol % or smaller.

In the case where the heat sensitive layer has liquid globules, it is preferred that the heat softening point of the heat sensitive layer is 50° C. or higher, and more preferred is 60° C. or higher. If the heat softening point is 50° C. or higher, the flow of the heat sensitive layer at room temperature can be inhibited, and consequently the sensitivity after lapse of time can be further enhanced. The heat softening point of the heat sensitive layer greatly depends on the heat softening point of the polymer having active hydrogen as the main component of the heat sensitive layer. For this reason, it is preferred to use a polymer with a heat softening point of 50° C. or higher as the polymer having active hydrogen. Above all, a polymer with a heat softening point of 50° C. or higher having alcoholic hydroxyl groups, phenolic hydroxyl groups or carboxyl groups is more preferred, and a polymer with a heat softening point of 50° C. or higher having phenolic hydroxyl groups (the homopolymer or copolymer of p-hydroxystyrene, novolac resin, resol resin or the like) is further more preferred.

In the directly imageable waterless lithographic printing plate precursor of this invention, it is preferred that the average thickness of the heat sensitive layer in the portion wherein the non-photosensitive particles are not present is 0.3 μm or larger, and more preferred is 0.8 μm or larger. On the other hand, preferred is 10 μM or smaller, and more preferred is 0.7 μm or smaller. If the average thickness of the heat sensitive layer in the portion where the non-photosensitive particles are not present is 0.3 μm or larger, the developing properties are unlikely to decline. If the average thickness is 10 μm or smaller, the effect of enhancing the anti-blister performance is likely to be exhibited, while any disadvantage in view of economy does not occur. In this case, the average thickness of the heat sensitive layer in the portion where the non-photosensitive particles are not present can be obtained by observation with a TEM. In more detail, a sample is prepared from a directly imageable waterless lithographic printing plate precursor by an ultrathin section method and observed with a TEM at an accelerating voltage of 100 kV and at a magnification of 2000×. On the TEM photo showing a vertical cross section, film thicknesses are measured at 10 places selected at random from the heat sensitive layer in the smooth portion where the non-photosensitive particles are not present, and the number average value is calculated from the measured thicknesses, to obtain the average film thickness.

In the directly imageable lithographic printing plate precursor of this invention, the silicone rubber layer can be a layer obtained by coating an addition reaction type silicone rubber layer composition or condensation reaction type silicone rubber layer composition or a layer obtained by coating any of these compositions and (heating for) drying.

It is preferred that the addition reaction type silicone rubber layer composition contains at least a vinyl group-containing organopolysiloxane, SiH group-containing compound (addition reaction type crosslinking agent) and curing catalyst. Further, a reaction inhibitor can also be contained.

The vinyl group-containing organopolysiloxane has a structure represented by the following general formula (I), and has a vinyl group at an end of the main chain or in the main chain. Above all, it is preferred to have a vinyl group at an end of the main chain. Two or more of such vinyl group-containing organopolysiloxanes can also be contained.

$$-(SiR^1R^2-O-)_n \qquad (I)$$

where n denotes an integer of 2 or more, and $R^1$ and $R^2$ each denote, respectively independently, a saturated or unsaturated hydrocarbon group with 1 to 50 carbon atoms. The hydrocarbon group can be of straight chain, or branched or cyclic and may also contain an aromatic ring.

In the abovementioned formula, it is preferred in view of the ink repellency of the printing plate that 50% or more of all the groups represented by $R^1$ and $R^2$ are methyl groups. Further, from the viewpoints of handling properties and the ink repellency and flaw resistance of the printing plate, it is preferred that the weight average molecular weight of the vinyl group-containing organopolysiloxane is 10,000 to 600,000.

The SiH group-containing compound can be, for example, an organohydrogenpolysiloxane or an organic polymer having diorganohydrogensilyl groups, and an organohydrogenpolysiloxane is preferred. Two or more of such SiH group-containing compounds can also be contained.

The organohydrogenpolysiloxane has a straight-chain, cyclic, branched or reticulate molecular structure and can be a polymethylhydrogensiloxane capped by trimethylsiloxy groups at both ends of the molecular chain, a dimethylsiloxane-methylhydrogensiloxane copolymer capped by trimethylsiloxy groups at both ends of the molecular chain, a dimethylsiloxane-methylhydrogensiloxane-methylphenylsiloxane copolymer capped by trimethylsiloxy groups at both ends of the molecular chain, a dimethylpolysiloxane capped by dimethylhydrogensiloxy groups at both ends of the molecular chain, a dimethylsiloxane-methylphenylsiloxane copolymer capped by dimethylhydrogensiloxy groups at both ends of the molecular chain, methylphenylpolysiloxane capped by dimethylhydrogensiloxy groups at both ends of the molecular chain, an organopolysiloxane copolymer comprising siloxane units represented by formula $R_3SiO_{1/2}$, siloxane units represented by formula $R_2HSiO_{1/2}$ and siloxane units represented by formula $SiO_{4/2}$, an organopolysiloxane copolymer comprising siloxane units represented by formula $R_2HSiO_{1/2}$ and siloxane units represented by formula $SiO_{4/2}$, an organopolysiloxane copolymer comprising siloxane units represented by formula $RHSiO_{2/2}$ and siloxane units represented by formula $RSiO_{3/2}$ or siloxane units represented by formula $HSiO_{3/2}$, or the like. Two or more of these organopolysiloxanes may also be used. In the abovementioned formulae, R denotes a monovalent hydrocarbon group other than an alkenyl group and may also be substituted. Examples of the monovalent hydrocarbon group can be an alkyl group such as a methyl group, ethyl group, propyl group, butyl group, pentyl group, hexyl group or heptyl group, aryl group such as a phenyl group, tolyl group, xylyl group or naphthyl group, aralkyl group such as a benzyl group or phenethyl group, or halogenated alkyl group such as a chloromethyl group, 3-chloropropyl group or 3,3,3-trifluoropropyl group.

Examples of the organic polymer having diorganohydrogensilyl groups include oligomers obtained by copolymerizing a dimethylhydrogensilyl group-containing (meth)acrylic monomer such as dimethylhydrogensilyl (meth)acrylate or dimethylhydrogensilylpropyl (meth)acrylate and a monomer such as methyl (meth)acrylate, ethyl (meth)acrylate, butyl (meth)acrylate, ethylhexyl (meth)acrylate, lauryl (meth) acrylate, styrene, α-methylstyrene, maleic acid, vinyl acetate or allyl acetate, and the like.

From the viewpoint of the curability of the silicone rubber layer, it is preferred that the content of the SiH group-containing compound is 0.5 wt % or larger in the silicone rubber layer composition, and more preferred is 1 wt % or larger. Further, 20 wt % or smaller is preferred, and 15 wt % or smaller is more preferred.

Examples of the reaction inhibitor include a nitrogen-containing compound, phosphorus-based compound, unsaturated alcohol and the like. An acetylene group-containing alcohol can be preferably used. Two or more of these reaction inhibitors can also be contained. If any of these reaction inhibitors is contained, the curing rate of the silicone rubber layer can be adjusted. From the viewpoint of the stability of the silicone rubber layer composition and the solution thereof, it is preferred that the content of the reaction inhibitor is 0.01 wt % or larger in the silicone rubber layer composition. More preferred is 0.1 wt % or larger. Further, from the viewpoint of the curability of the silicone rubber layer, it is preferred that the content is 20 wt % or smaller in the silicone rubber layer composition, and more preferred is 15 wt % or smaller.

The curing catalyst is selected from those publicly known. Preferred is a platinum-based compound, and more specifically, platinum per se, platinum chloride, chloroplatinic acid, olefin coordinated platinum, alcohol modified complex of platinum, methylvinylpolysiloxane complex of platinum, and the like can be enumerated. Two or more of these curing catalysts can also be contained. From the viewpoint of the curability of the silicone rubber layer, it is preferred that the content of the curing agent is 0.001 wt % or larger in the silicone rubber layer composition, and more preferred is 0.01 wt % or larger. Further, from the viewpoint of the stability of the silicone rubber composition and the solution thereof, it is preferred that the content in the silicone rubber layer composition is 20 wt % or smaller, and more preferred is 15 wt % or smaller.

Furthermore, in addition to these components, a hydroxyl group-containing organopolysiloxane or a hydrolysable functional group-containing silane (or siloxane) can also be contained. A publicly known filler such as silica can also be contained for the purpose of enhancing rubber strength and a publicly known silane coupling agent can also be contained for the purpose of enhancing adhesion. As the silane coupling agent, an alkoxysilane, acetoxysilane, ketoximino silane or the like is preferred, and especially a silane coupling agent having a vinyl group or allyl group is preferred.

It is preferred that the condensation reaction type silicone rubber layer composition contains at least a hydroxyl group-containing organopolysiloxane, crosslinking and curing catalyst.

The hydroxyl group-containing organopolysiloxane has a structure represented by the aforementioned general formula (I) and has a hydroxyl group at an end of the main chain or in the main chain. Above all, an organopolysiloxane having a hydroxyl group at an end of the main chain is preferred. Two or more of such hydroxyl group-containing organopolysiloxanes can also be contained.

Examples of the crosslinking agent include de-acetylated, de-oximated, de-alcoholated, de-acetonated, de-amidated, de-hydroxylaminated and other silicon compounds represented by the following general formula (II).

$$(R^3)_{4-m}SiX_m \qquad (II)$$

where m denotes an integer of 2 to 4; each $R^3$ denotes, respectively independently, a substituted or non-substituted alkyl group with 1 or more carbon atoms, alkenyl group, aryl group or a group obtained by combining the foregoing; each X denotes, respectively independently, a hydrolysable group. Examples of the hydrolysable group include acyloxy groups such as acetoxy group, ketoxime groups such as methylethylketoxime group, alkoxy groups such as methoxy group, ethoxy group, propoxy group and butoxy group, alkenyloxy groups such as isopropenoxy group, acylalkylamino groups such as acetylethylamino group, and aminoxy groups such as dimethylaminoxy group. In the abovementioned formula, it is preferred that the number m of hydrolysable groups is 3 or 4.

Specific examples of the crosslinking agent include acetoxysilanes such as methyltriacetoxysilane, ethyltriacetoxysilane, vinyltriacetoxysilane, allyltriacetoxysilane, phenyltriacetoxysilane, and tetraacetoxysilane, ketoximinosilanes such as vinylmethylbis(methylethylketoximino)silane, methyltris(methylethylketoximino)silane, ethyltris(methylethylketoximino)silane, vinyltris (methylethylketoximino)silane, allyltris (methylethylketoximino)silane, phenyltris (methylethylketoximino)silane, and tetrakis (methylethylketoximino)silane, alkoxysilanes such as methyltrimethoxysilane, methyltriethoxysilane, ethyltrimethoxysilane, ethyltriethoxysilane, tetraethoxysilane, tetrapropoxysilane, vinyltrimethoxysilane, vinyltriethoxysilane, allyltriethoxysilane, and vinyltriisopropoxysilane, alkenyloxysilanes such as vinyltrisisopropenoxysilane, diisopropenoxydimethylsilane, and triisopropenoxymethylsilane, tetraallyloxysilane, etc., though not limited thereto. Among them, from the viewpoints of the curing rate and handling properties of the silicone rubber layer, etc., acetoxysilanes and ketoxyminosilanes are preferred. Two or more of them can also be contained.

From the viewpoint of the stability of the silicone rubber layer composition and the solution thereof, it is preferred that the content of the crosslinking agent is 0.5 wt % or larger in the silicone rubber layer composition. More preferred is 1 wt % or larger. Further, from the viewpoints of the strength of the silicone rubber layer and the flaw resistance of the printing plate, it is preferred that the content is 20 wt % or smaller in the silicone rubber layer composition, and more preferred is 15 wt % or smaller.

Examples of the curing catalyst include organic carboxylic acids, acids, alkalis, amines, metal alkoxides, metal diketonates, organic acid salts of metals such as tin, lead, zinc, iron, cobalt, calcium and manganese, etc. Specific examples of the curing catalyst include dibutyltin diacetate, dibutyltin dioctate, dibutyldin dilaurate, zinc octylate, iron octylate, etc. Two or more of them can also be contained.

From the viewpoint of the curability and adhesion of the silicone rubber layer, it is preferred that the content of the curing catalyst is 0.001 wt % or larger in the silicone rubber layer composition, and more preferred is 0.01 wt % or larger. Further, from the viewpoint of the stability of the silicone rubber layer composition and the solution thereof, it is preferred that the content is 15 wt % or smaller in the silicone rubber layer composition, and more preferred is 10 wt % or smaller.

Further, in addition to these components, for the purpose of enhancing the rubber strength, a publicly known filler such as silica can also be contained.

Further, for the purpose of giving a proofing capability to the developed waterless lithographic printing plate, it is preferred that the silicone rubber layer contains a color pigment. In this case, the color pigment in this invention refers to a pigment capable of absorbing any light in a visible light wavelength range (380 to 780 nm).

In general, a pigment is insoluble in solvents such as water and aliphatic hydrocarbons, and consequently, if a pigment is contained, compared with the case where a dye soluble in water and other solvents is contained, the extraction of the coloring matter by water and an organic chemical solution used in the development step or by the solvent in the ink used in the printing step or by any of various washing agents can be remarkably inhibited.

The proofing capability of a developed waterless lithographic printing plate can be visual proofing capability with eyes or instrumental proofing capability by a halftone dot area rate measuring instrument. In general, since the instrumental proofing capability is lower than the visual proofing capability in image identification capability, a waterless lithographic printing plate good in instrumental proofing capability is good also in visual proofing capability in many cases.

A general halftone dot area rate measuring instrument irradiates the halftone dot portions formed on a printing plate with any light of blue light (wavelength 400 to 500 nm), green light (wavelength 500 to 600 nm), red light (wavelength 600 to 700 nm) and white light (wavelength 400 to 700 nm), and the halftone dot area rate is calculated from the difference between the light quantity reflected from the image area and the light quantity reflected from the non-image area. Consequently in the case where the difference between the light quantity reflected from the image area and the light quantity reflected from the non-image area is small or in the case where there is no difference between the reflected light quantities, it is difficult to measure the halftone dot area rate, and the instrumental proofing capability declines. Many of the organic compounds constituting the heat insulating layer and the heat sensitive layer of the directly imageable waterless lithographic printing plate precursor absorb blue light, and consequently in the case where a silicone rubber layer colored by a yellow, orange or other color pigment capable of absorbing blue light is used, the difference between the light quantity reflected from the image area and the light quantity reflected from the non-image area becomes so small as to lower the instrumental proofing capability. Further, there is also a case where the visual proofing capability also declines. For this reason, from the viewpoints of instrumental proofing capability and visual proofing capability, it is preferred to use a color pigment capable of absorbing green light or red light. Furthermore, among the color pigments capable of absorbing green light or red light, from the viewpoint of the dispersibility in the silicone rubber layer composition and the solution thereof, a color pigment with a density of 3 $g/cm^3$ or lower is preferred. Color pigments with a density of 3 $g/cm^3$ or lower include Cobalt Blue, Milori Blue, Hydrous Silicate, Ultramarine, Carbon Black, printed pigments obtained by printing such dyes as Rhodamine, Methyl Violet, Peacock Blue, Alkali Blue, Malachite Green and Alizarin to extender pigments (calcium carbonate powder, precipitated calcium carbonate, gypsum, asbestos, clay, silica powder, diatomaceous earth, talc, basic magnesium carbonate and alumina white), Alkali Blue, Aniline Black, Lithol Red, Lake Red C, Brilliant Carmine 6B, Watch Young Red, Bordeaux 10B, Para Red, Lake Red 4R, Naphthol Red, Cromophtal Scarlet RN, Phthalocyanine Blue, Fast sky Blue, Phthalocyanine Green Anthraquinone-based pigments, Perylene Red, Thio Indigo Red, Indanthrone Blue, Quinacridone Red, Quinacridone Violet, Dioxazine Violet, Naphthol Green B, etc. Two or more of the pigments can also be contained.

In the directly imageable waterless lithographic printing plate precursor of this invention, it is preferred that the content of the color pigment is 0.1 vol % or larger in the silicone rubber layer. More preferred is 0.2 vol % or larger. Further, from the viewpoint of maintaining the ink repellency of the silicone rubber layer, preferred is 20 vol % or smaller, and more preferred is 10 vol % or smaller.

In order to enhance the dispersibility of the color pigment in the silicone rubber layer, it is preferred that the silicone rubber layer composition contains a pigment dispersing agent. If the pigment dispersing agent is contained, the cohesion of the color pigment in the case where the silicone rubber layer composition is diluted by a solvent or the cohesion of the color pigment caused in the silicone rubber layer composition or the solution thereof with lapse of time can be inhibited. As the dispersing agent, preferred is a pigment dispersing agent which can sufficiently wet the surface of the pigment and which is good in affinity with low polar compounds such as the organopolysiloxane and the solvent used for diluting the color pigment-containing silicone liquid described later. If the pigment dispersing agent is as described above, a publicly known pigment dispersing agent can be used. The pigment dispersing agent may also be used under the name of a surfactant or surface modifying agent as the case may be. As the pigment dispersing agent, an organic complex compound comprising a metal and an organic compound, an amine-based pigment dispersing agent, an acid-based pigment dispersing agent, a nonionic surfactant or the like can be enumerated. Among them, an organic complex compound comprising a metal and an organic compound or an amine-based pigment dispersing agent is preferred.

Examples of the metal and the organic compound forming the organic complex compound include the metals and organic compounds forming the metal complex compounds presented before as examples of the crosslinking agent of the heat sensitive layer. Among them, as the organic compound, acid compounds such as carboxylic acids, phosphoric acid and sulfonic acids, and diketones, ketoesters and diester compounds capable of forming chelate rings with metals are preferred in view of the coordination forces to metals.

The simplest organic complex compound used as the pigment dispersing agent can be obtained by stirring any of the abovementioned organic compounds and a metal alkoxide at room temperature or with heating, and exchanging the ligands. It is preferred to coordinate one or more molecules of the abovementioned organic compound to one metal.

Examples of the commercially available organic complex compounds each comprising a metal and an organic compound are presented below. Aluminum-based compounds: “Octope” (registered trademark) A1, “Olipe” A00, AO2 (respectively produced by Hope Chemical Co., Ltd.), “Plenact” (registered trademark) AL-M (produced by Ajinomoto Fine-Techno Co., Inc.), etc. Titanium-based compounds: “Plenact” KR-TTS, KR46B, KR55, KR41B, KR38S, KR138S, KR238S, KR338X, KR9SA (respectively produced by Ajinomoto Fine-Techno Co., Inc.), “KEN-REACT” (registered trademark) TTS-B, 5, 6, 7, 10, 11, 12, 15, 26S, 37BS, 43, 58CS, 62S, 36B, 46B, 101, 106, 110S, 112S, 126S, 137BS, 158DS, 201, 206, 212, 226, 237, 262S (respectively produced by KENRICH), etc.

The abovementioned organic complex compounds can be suitably used especially for the addition reaction type silicone rubber layer. Above all, the organic complex compound not containing any of primary and secondary amines, phosphorus and sulfur in the molecule does not act as a catalyst poison of a platinum catalyst, and consequently is very suitable when used for an addition reaction type silicone for accelerating curing using a platinum catalyst.

On the other hand, as the amine-based pigment dispersing agent, either a monoamine type having one amino group in the molecule or a polyamine type having multiple amino groups in the molecule can be suitably used. Specifically “SOLSPERSE” (registered trademark) 9000, 13240, 13650, 13940, 17000, 18000, 19000, 28000 (respectively produced by LUBRIZOL) and the like can be enumerated.

It is preferred that the pigment dispersing agent is contained by 2 to 30 $mg/m^2/g$ based on the surface area of the pigment. In other words, for example, in the case where 10 g of a pigment with a specific surface area of 50 $m^2/g$ is contained, it is preferred that the content of the pigment dispersing agent is 1 to 15 g.

In the directly imageable waterless lithographic printing plate precursor of this invention, it is preferred that the average layer thickness of the silicone rubber layer on the heat sensitive layer in the portion where the non-photosensitive particles are not present is 0.5 to 20 μm. If the average layer thickness of the silicone rubber layer on the heat sensitive layer in the portion where the non-photosensitive particles are not present is 0.5 $g/m^2$ or larger, the ink repellency, flaw resistance and printing durability of the printing plate become sufficient, and if the average layer thickness is 20 $g/m^2$ or smaller, no disadvantage occurs from the economical viewpoint, and neither developing properties nor ink mileage is likely to occur. In this case, the average layer thickness of the silicone rubber layer on the heat sensitive layer in the portion where the non-photosensitive particles are not present can be obtained by observation with a TEM. In more detail, a sample is prepared from the directly imageable waterless lithographic printing plate precursor by an ultrathin section method, and is observed with a TEM at an accelerating voltage of 100 kV at a magnification of 2000×. In a TEM photo showing a vertical cross section, the layer thicknesses are measured at 10 places selected at random from the silicone rubber layer on the heat sensitive layer in the smooth portion free from the presence of the non-photosensitive particles, and the number average value is calculated to obtain the average layer thickness.

For the purposes of enhancing the adhesion between the substrate and the heat sensitive layer, preventing halation, enhance the proofing capability, enhancing the heat insulation, enhancing the printing durability, etc., a heat insulating layer may also be formed on the aforementioned substrate. The heat insulating layer used in this invention can be any of the heat insulating layers described, for example, in JP2004-199016A, JP2004-334025A, JP2006-276385A, etc.

The directly imageable waterless lithographic printing plate precursor of this invention may also have a protective film and/or synthetic paper for the purpose of protecting the silicone rubber layer.

As the protective film, preferred is a film with a thickness of 100 μm or smaller, which allows the light with the wavelength of the exposure light source to be transmitted well. Typical examples include polyethylene, polypropylene, polyvinyl chloride, polyethylene terephthalate, cellophane, etc. Further, for the purpose of preventing the precursor from being photosensitized by exposure, any of various photo-absorbents, optically discoloring materials and optically color-developing materials as described in JP2-063050A can be provided on the protective film.

It is preferred that the weight per unit area of the synthetic paper is 30 to 120 $g/m^2$, and a more preferred range is 30 to 90 $g/m^2$. If the weight per unit area is 30 $g/m^2$ or higher, the mechanical strength is sufficient. If the weight is 120 $g/m^2$ or lower, there is an economical advantage, and the laminate comprising the directly imageable waterless lithographic printing plate precursor and paper becomes thin advantageously for working convenience. Examples of preferably used synthetic paper include information recording paper 40 $g/m^2$ (produced by Nagoya Pulp K.K.), metal-containing synthetic paper 30 $g/m^2$ (produced by Nagoya Pulp K.K.), unbleached kraft paper 50 $g/m^2$ (produced by Chuetsu Pulp & Paper Co., Ltd.), NIP paper 52 $g/m^2$ (produced by Chuetsu Pulp & Paper Co., Ltd.), pure white roll paper 45 $g/m^2$ (produced by Ojipaper Co., Ltd.), and Clupak 73 $g/m^2$ (produced by Ojipaper Co., Ltd.), though not limited thereto.

The method for producing the directly imageable waterless lithographic printing plate precursor of this invention is explained below. The method for producing the directly imageable lithographic printing plate precursor of this invention can be, for example, a method having at least (a) a step of coating a substrate or a substrate having a heat insulating layer laminated thereon with a heat sensitive layer composition solution having non-photosensitive particles dispersed therein, (b) a step of drying the heat sensitive layer composition solution, to form a heat sensitive layer, and (c) a step of coating the heat sensitive layer with a silicone rubber layer composition, to form a silicone rubber layer. Further, as an alternative to the aforementioned step (c), the method may have (d) a step of coating the heat sensitive layer with a silicone rubber composition solution and (e) a step of drying the silicone rubber layer composition solution, to form a silicone rubber layer.

At first, (a) a step of coating a substrate or a substrate having a heat insulating layer laminated thereon with a heat sensitive layer composition solution having non-photosensitive particles dispersed therein is explained. The method for dispersing the non-photosensitive particles into the heat sensitive layer composition solution can be, for example, a method of dispersing the non-photosensitive particles into a solvent or a resin diluent or the like constituting the heat sensitive layer composition solution, to prepare a dispersion, and mixing the obtained dispersion with the other components, or a method of mixing and dispersing the non-photosensitive particles into a solution containing all the other components constituting the heat sensitive layer composition solution, or the like.

For dispersing the non-photosensitive particles, a general dispersing machine such as a three-roll mill, paint shaker, ball mill, beads mill, sand mill, disperser, homogenizer, attritor or ultrasonic dispersing machine can be used.

Further, if the heat sensitive layer composition solution is made to contain a solvent with a solubility parameter of 17.0 $(MPa)^{1/2}$ or less and a boiling point in a range from 210 to 270° C. and a solvent with a solubility parameter of more than 17.0 $(MPa)^{1/2}$, liquid globules containing a liquid having a boiling point in a range from 210 to 270° C. can be formed in the heat sensitive layer.

Specific examples of the solvent with a solubility parameter of 17.0 $(MPa)^{1/2}$ or less and a boiling point in a range from 210 to 270° C. include straight-chain, branched or cyclic hydrocarbons with 12 to 18 carbon atoms, aliphatic saturated hydrocarbons such as Normal Paraffin Grade M (boiling point 219 to 247° C., solubility parameter 16.2 $(MPa)^{1/2}$ (produced by Nippon Oil Corporation)), Normal Paraffin Grade H (boiling point 244 to 262° C., solubility parameter 16.2 $(MPa)^{1/2}$ (produced by Nippon Oil Corporation)), "NClean" 230 (boiling point 227° C., solubility parameter 16.2 $(MPa)^{1/2}$ (produced by JX Nippon Sun-Energy Corporation)), "Isopar" (registered trademark) M (boiling point 223 to 254° C., solubility parameter 14.7 $(MPa)^{1/2}$ (produced by Esso Kagaku K.K.)), "IP Solvent" 2028 (boiling point 213 to 262° C., solubility parameter 14.3 $(MPa)^{1/2}$ (produced by Idemitsu Kosan Co., Ltd.)), and"IP Clean" HX (boiling point 222 to 261° C., solubility parameter 14.3 $(MPa)^{1/2}$ (produced by Idemitsu Kosan Co., Ltd.), alicyclic hydrocarbons such as "Naphtesol" (registered trademark) 220 (boiling point 221 to 240° C., solubility parameter 16.4 $(MPa)^{1/2}$ (produced by Nippon Oil Corporation), and alkylene glycol dialkyl ethers such as diethylene glycol butylmethyl ether (boiling point 212° C., solubility parameter 16.0 $(MPa)^{1/2}$), diethylene glycol dibutyl ether (boiling point 256° C., solubility parameter 15.8 $(MPa)^{1/2}$), triethylene glycol dimethyl ether (boiling point 216° C., solubility parameter 16.2 $(MPa)^{1/2}$), triethylene glycol butylmethyl ether (boiling point 261° C., solubility parameter 16.2 $(MPa)^{1/2}$), and tripropylene glycol dimethyl ether (boiling point 215° C., solubility parameter 15.1 $(MPa)^{1/2}$). Two or more of them can also be contained.

Specific examples of the solvent with a solubility parameter of 17.0 $(MPa)^{1/2}$ less and a boiling point in a portion of the range from 210 to 270° C. include "Naphtesol" 200 (boiling point 201 to 217° C., solubility parameter 16.2 $(MPa)^{1/2}$ (produced by Nippon Oil Corporation)), "Dust Clean" 300 (boiling point 201 to 217° C., solubility parameter 16.2 $(MPa)^{1/2}$ (produced by Matsumura Oil Co., Ltd.), "Dust Clean" 300AF (boiling point 201 to 217° C., solubility parameter 16.2 $(MPa)^{1/2}$ (produced by Matsumura Oil Co., Ltd.), polyethylene glycol dimethyl ether (boiling point 264 to 294° C., solubility parameter 16.6 $(MPa)^{1/2}$), etc. Two or more of them can also be contained.

In the solvent with a solubility parameter of 17.0 $(MPa)^{1/2}$ or less contained in the heat sensitive layer composition solution, it is preferred that the rate of the liquids with boiling points in a range from 210 to 270° C. is 80 wt % or larger. More preferred is 90 wt % or larger, and further more preferred is 95 wt % or larger. Still further more preferred is 100 wt %.

From the viewpoint of enhancing the initial sensitivity and the sensitivity after lapse of time, it is preferred that the content of the solvent with a solubility parameter of 17.0 $(MPa)^{1/2}$ or less and a boiling point in a range from 210 to 270° C. is 0.1 part by weight or larger per 100 parts by weight of the solid content of the heat sensitive layer, and more preferred is 1 part by weight or larger. On the other hand, from the viewpoint of the coating properties of the heat sensitive layer composition solution, it is preferred that the content of the solvent is 60 pats by weight or smaller per 100 parts by weight of the solid content of the heat sensitive layer, and more preferred are 25 parts by weight or smaller. Further, from the viewpoint of enhancing the initial sensitivity and the sensitivity after lapse of time, it is preferred that the content is 0.1 wt % or larger in the heat sensitive layer composition solution, and more preferred is 0.5 wt % or larger. On the other hand, from the viewpoint of the coating properties of the heat sensitive layer composition solution, it is preferred that the content is 10 wt % or smaller in the heat sensitive layer composition solution. More preferred is 7 wt % or smaller, and further more preferred is 5 wt % or smaller.

It is preferred that the solvent with a solubility parameter of more than 17.0 $(MPa)^{1/2}$ can dissolve or disperse the heat sensitive layer components. Examples of the solvent include alcohols, ethers, ketones, esters, amides, etc. Two or more of them can also be contained.

Examples of the alcohols include methanol, ethanol, 1-propanol, isopropanol, 1-butanol, isobutanol, 2-butanol, 2-methyl-2-propanol, 1-pentanol, 2-methyl-1-butanol, 3-methyl-1-butanol, 2-pentanol, 3-pentanol, 2-methyl-2-butanol, 1-hexanol, 2-hexanol, 3-hexanol, 4-methyl-2-pentanol, 2-ethylbutanol, 1-heptanol, 2-heptanol, 3-heptanol, 2,4-dimethylpenta-3-ol, 1-octanol, 2-octanol, 2-ethylhexanol, 1-nonanol, 2,6-dimethyl-4-heptanol, 1-decanol, ethylene glycol, diethylene glyclol, triethylene glycol, tetraethylene glycol, propylene glycol, dipropylene glycol, 1,4-butylene glycol, 2,3-butylene glycol, 2-ethyl-1,3-hexanediol, glycerol, benzyl alcohol, α-methylbenzyl alcohol, cyclopentanol, cyclohexanol, methylcyclohexanol, furfuryl alcohol, tetrahydrofurfuryl alcohol, etc.

Examples of the ethers include ethylene glycol monomethyl ether, ethylene glycol monoethyl ether, ethylene glycol monopropyl ether, ethylene glycol monobutyl ether, ethylene glycol monoethylhexyl ether, ethylene glycol monophenyl ether, ethylene glycol monobenzyl ether, ethylene glycol dimethyl ether, ethylene glycol diethyl ether, ethylene glycol dipropyl ether, ethylene glycol dibutyl ether, diethylene glycol monomethyl ether, diethylene glycol monoethyl ether, diethylene glycol monopropyl ether, diethylene glycol monobutyl ether, diethylene glycol dimethyl ether, diethylene glycol diethyl ether, diethylene glycol dipropyl ether, diethylene glycol dibutyl ether, tetraethylene glycol dimethyl ether, tetraethylene glycol dibutyl ether, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, dipropylene glycol monomethyl ether, dipropylene glycol monoethyl ether, dipropylene glycol monopropyl ether, dipropyelne glycol monobutyl ether, dipropylene glycol dimethyl ether, dipropylene glycol diethyl ether, dipropylene glycol dipropyl ether, dipropylene glycol dibutyl ether, tripropylene glycol monomethyl ether, methylphenyl ether, dimethoxymethane, diethyl acetal, propylene oxide, dioxane, dimethyldioxane, trioxane, dioxolane, methyldioxolane, tetrahydrofuran, tetrahydropyran, etc.

Examples of the ketones include acetone, methyl ethyl ketone, methyl propyl ketone, diethyl ketone, methyl butyl ketone, methyl isobutyl ketone, ethyl propyl ketone, ethyl butyl ketone, dipropyl ketone, dibutyl ketone, diisobutyl ketone, methyl pentyl ketone, methyl hexyl ketone, ethyl pentyl ketone, propyl butyl ketone, ethyl hexyl ketone, propyl pentyl ketone, propyl hexyl ketone, butyl pentyl ketone, butyl hexyl ketone, dipentyl ketone, pentyl hexyl ketone, dihexyl ketone, methyl isobutenyl ketone, diacetone alcohol, cyclopentanone, cyclohexanone, methylcyclohexanone, methyl phenyl ketone, isophorone, acetylacetone, acetonylacetone, etc.

Examples of the esters includemethyl formate, ethyl formate, butyl formate, pentyl formate, methyl acetate, ethyl acetate, propyl acetate, isopropyl acetate, butyl acetate, isobutyl acetate, pentyl acetate, hexyl acetate, cyclohexyl acetate, phenyl acetate, methyl propionate, ethyl propionate, propyl propionate, butyl propionate, pentyl propionate, methyl butyrate, ethyl butyrate, butyl butyrate, pentyl butyrate, ethyl crotonate, butyl crotonate, methyl benzoate, ethyl benzoate, benzyl benzoate, methyl lactate, ethyl lactate, propyl lactate, butyl lactate, pentyl lactate, hexyl lactate, cyclohexyl lactate, methyl salicylate, ethyl salicylate, ethylene glycol monomethyl ether acetate, ethylene glycol monoethyl ether acetate, diethylene glycol monomethyl ether acetate, diethylene glycol monoethyl ether acetate, diethylene glycol monobutyl ether acetate, triethylene glycol monomethyl ether acetate, methoxybutyl acetate, dimethyl oxalate, diethyl oxalate, dimethyl malonate, diethyl malonate, dimethyl maleate, diethyl maleate, γ-butyrolactone, γ-valerolactone, ethylene carbonate, propylene carbonate, dimethyl carbonate, diethyl carbonate, etc.

Examples of the amides include N,N-dimethylformamide, N,N-dimethylacetamide, N-methyl-2-pyrrolidone, etc.

In addition, methyl carbamidate, ethyl carbamidate, tetramethylurea, 1,3-dimethyl-2-imidazolidinone, dimethyl sulfoxide, sulfolane, acetonitrile, and the like can also be contained.

Among the abovementioned solvents, a solvent compatible with a liquid having a solubility parameter of 17.0 $(MPa)^{1/2}$ or less and a boiling point in a range from 210 to 270° C. is especially preferred.

The size of the liquid globules has close relationships with the boiling point of the solvent with a solubility parameter of more than 17.0 $(MPa)^{1/2}$ and the atmosphere temperature at which the heat sensitive layer composition solution is coated. In the case where a solvent with such a low boiling point that the solvent can be easily evaporated at the atmosphere temperature at which the heat sensitive layer composition solution is coated is used as the solvent with a solution parameter of more than 17.0 $(MPa)^{1/2}$, the solvent with a low boiling point is quickly evaporated and dried before the components forming the liquid globules adjacent to each other begin to gather. Consequently, small liquid globules are formed in the heat sensitive layer. On the other hand, in the case where a solvent with such a high boiling point that the solvent cannot be easily evaporated at the atmosphere temperature at which the heat sensitive layer composition solution is coated is used, the solvent with a high boiling point is slowly evaporated and dried while the components forming the liquid globules adjacent to each other gather. Consequently, large liquid globules are formed in the heat sensitive layer.

It is preferred that the solvent with the abovementioned solubility parameter of more than 17.0 $(MPa)^{1/2}$ contains a solvent with a boiling point of 30 to 200° C. by an amount of 80 wt % or larger, and more preferred is an amount of 95 wt % or larger. Further, it is preferred that a solvent with a boiling point of 80° C. or lower by an amount of 80 wt % or larger, and more preferred is an amount of 95 wt % or larger. Further, it is preferred that a solvent with a boiling point of 70° C. or lower is contained by an amount of 80 wt % or larger, and more preferred is an amount of 95 wt % or larger. If a solvent with a boiling point of 30° C. or higher is contained by an amount 80 wt % or larger, a coating solution stable at room temperature can be easily produced without using any special cooling device. Further, if a solvent with a boiling point of 200° C. or lower is contained by an amount of 80 wt % larger, the heat sensitive layer can be easily removed by the drying described later.

Furthermore, if the boiling point of the solvent with a solubility parameter of more than 17.0 $(MPa)^{1/2}$ is lower than the heat softening point of the polymer with active hydrogen, the liquid globules can be advantageously formed.

The heat sensitive layer composition solution contains the aforementioned heat sensitive layer components, a solvent with a solubility parameter of 17.0 $(MPa)^{1/2}$ or less and a boiling point in a range from 210 to 270° C., a solvent with a solubility parameter of more than 17.0 $(MPa)^{1/2}$ and other components as required. It is preferred that the total solid concentration of the heat sensitive layer composition solution is 2 to 50 wt %.

A substrate may be directly coated with the abovementioned heat sensitive layer composition solution, or as required, a resin layer such as a heat insulating layer laminated on the substrate as required may also be coated with the heat sensitive layer composition solution. It is preferred that the coating surface of the substrate is degreased.

Examples of the coating apparatus include a slit die coater, direct gravure coater, offset gravure coater, reverse roll coater, natural roll coater, air knife coater, roll blade coater, Banbury roll blade coater, two-stream coater, rod coater, dip coater, curtain coater, spin coater, etc. In view of coating film accuracy, productivity and cost, a slit die coater, gravure coater and roll coater are especially preferred.

In view of the printing durability of the printing plate and excellent productivity due to easy volatilization of the diluting solvent, the adequate range of the coating amount of the heat sensitive layer composition solution is 0.1 to 10 $g/m^2$ as the weight after drying. A preferred range is 0.5 to 7 $g/m^2$.

Next, (b) a step of drying the heat sensitive layer composition solution, to form a heat sensitive layer is explained. The heat sensitive layer composition solution is dried with or without heating. In the case of heating, it is preferred to dry at 30 to 190°, more preferably 50 to 150° C. for 30 seconds to 5 minutes using a hot air dryer, infrared dryer or the like.

Next, (c) a step of coating the heat sensitive layer with a silicone rubber layer composition, to form a silicone rubber layer, (d) a step of coating the heat sensitive layer with a silicone rubber composition solution and (e) a step of drying the silicone rubber layer composition solution, to form a silicone rubber layer are explained. In this case, the silicone rubber layer composition is a solvent-less liquid comprising materials forming the silicone rubber layer, and the silicone rubber layer composition solution is a diluted solution containing the silicone rubber layer composition and the solvent.

Examples of the solvent used for dispersing the color pigment or used in the silicone rubber layer composition solution include aliphatic saturated hydrocarbons, aliphatic unsaturated hydrocarbons, alicyclic hydrocarbons, halogenated hydrocarbons, ethers, etc. It is preferred that the solubility parameter of these solvents is 17.0 $(MPa)^{1/2}$ or less, and more preferred is 15.5 $(MPa)^{1/2}$ or less. Examples of the solvent include aliphatic saturated hydrocarbons such as hexane, heptane, octane, nonane, decane, undecane, dodecane, isooctane, "Isopar" C, "Isopar" E, "Isopar" G, "Isopar" H, "Isopar" K, "Isopar" L, and "Isopar" M (respectively produced by Exxon Chemical Japan), aliphatic unsaturated hydrocarbons such as hexene, heptene, octene, nonene, and decene, alicyclic hydracarbons such as cyclopentane, cyclohexane, and methylcyclohexane, halogenated hydrocarbons such as trifluorotrichloroethane, ethers such as diethyl ether, diisopropyl ether, and diisobutyl ether, etc. Two or more of them can also be used. In view of economy and safety, aliphatic and alicyclic hydrocarbons are preferred. It is preferred that the number of carbon atoms of these aliphatic and alicyclic hydrocarbons is 4 to 20, and a more preferred range in the number of carbon atoms is 6 to 15.

Specific methods for producing (i) a silicone rubber layer composition and (ii) a silicone rubber layer composition solution are described below.

(i) A Silicone Rubber Layer Composition (without a Solvent)

For example, an organopolysiloxane containing hydroxyl groups or vinyl groups, and as required a color pigment, pigment dispersing agent and fine particles are homogeneously dispersed and mixed by a dispersing machine, to obtain a silicone paste. The dispersing machine used can be a three-roll mill, ball mil, beads mill, sand mill, disperser, homogenizer, attritor, ultrasonic dispersing machine, or the like. To the obtained silicone paste, a crosslinking agent, reaction catalyst, and as required, other additives (reaction inhibitor and the like) are added, and the mixture is stirred for homogenizing the respective components. The bubbles of the air strayed into the liquid are removed to obtain a silicone rubber layer composition. The air bubbles may be removed naturally or under reduced pressure, but removing the bubbles under reduced pressure is more preferred.

(ii) A Silicone Rubber Layer Composition Solution (Containing a Solvent)

For example, an organopolysiloxane containing hydroxyl groups or vinyl groups, and as required a color pigment, pigment dispersing agent and fine particles are homogeneously dispersed and mixed by any of the aforementioned dispersing machines, to obtain a silicone paste. The silicone paste is diluted by a solvent with stirring. It is preferred to filter the diluted solution using a general filter of paper, plastic, glass or the like, for removing the impurities (large particles of the insufficiently dispersed color pigment and the like) in the diluted solution. It is preferred to bubble the filtered diluted solution by dry air, dry nitrogen or the like, for removing the water contained in the solution. To the sufficiently water-removed solution, a crosslinking agent, reaction catalyst, and as required, other additives (reaction inhibitor and the like) are added, and the mixture is stirred to homogenize the respective components. Subsequently, the bubbles of the air strayed into the liquid are removed. The air bubbles may be removed naturally or under reduced pressure.

Further, another method for producing the silicone rubber layer composition solution containing a color pigment can be a method of producing a color pigment dispersion and a silicone liquid or a diluted silicone solution respectively separately, and mixing both the liquids later. The color pigment dispersion can be obtained by adding a color pigment and, as required, fine particles into a solution containing at least a pigment dispersing agent and a solvent, and dispersing and mixing the mixture homogeneously by any of the abovementioned dispersing machines. On the other hand, the silicone liquid can be obtained by mixing an organopolysiloxane containing hydroxyl groups or vinyl groups, crosslinking agent, reaction catalyst, and, as required, other additives (reaction inhibitor and the like). Further, if the obtained silicone liquid is diluted by a solvent, the diluted silicone solution can be obtained.

In the case where the heat sensitive layer is coated with the silicone rubber layer composition or the silicone rubber layer composition solution, from the viewpoint of adhesion, it is preferred to remove the water deposited on the surface of the heat sensitive layer as far as possible. A specific method is such that the silicone rubber layer composition or the silicone rubber layer composition solution is applied for coating within a space where water is removed by filling the space with a dry gas or continuously supplying the dry gas.

If the silicone rubber layer composition solution has been applied for coating, the silicone rubber layer composition solution is subsequently dried to form a silicone rubber layer. For drying and curing, heat treatment can also be performed. From the viewpoints of curability and the adhesion to the heat sensitive layer, it is preferred that the silicone rubber layer composition and the silicone rubber layer composition solution are heated immediately after coating.

From the viewpoint of protecting the precursor surface, it is preferred that the obtained directly imageable waterless lithographic printing plate precursor is covered with a protective film and/or synthetic paper, to be stored.

The method for producing a waterless lithographic printing plate from the directly imageable waterless lithographic printing plate precursor is explained below. In this case, a waterless lithographic printing plate refers to a printing plate having a pattern of a silicone rubber layer destined to be an ink repellent layer on the surface thereof, wherein the pattern of the silicone rubber layer is the non-image area while the portion free from the silicone rubber layer is the image area, to ensure that the printing plate can be used for the printing method of accepting the ink in the image area only by using the difference between the non-image area and the image area in ink acceptability and subsequently transferring the ink to a printing medium such as paper. The method for producing the waterless lithographic printing plate comprises a step of exposing the abovementioned directly imageable waterless lithographic printing plate precursor of this invention to a laser beam imagewisely (exposure step), and a step of rubbing the exposed directly imageable waterless lithographic printing plate precursor in the presence of water or in the presence of a liquid obtained by adding a surfactant to water, for removing the silicone rubber layer in the exposed area (development step).

At first, the exposure step will be explained. The directly imageable waterless lithographic printing plate precursor of this invention is exposed to a laser beam scanned imagewisely according to digital data. In the case where the directly imageable waterless lithographic printing plate precursor has a protective film, it is preferred to remove the protective film before exposure. The laser beam source used in the exposure step has, for example, the emitted light wavelength in a range from 700 to 1500 nm. Among the laser beam light sources available in this range, a semiconductor layer or YAG laser with the emitted light wave length in the vicinity of the near infrared range can be preferably used. Specifically from the viewpoint of precursor handling properties under daylight and the like, a laser beam with a wavelength of 780 nm, 830 nm or 1064 nm can be preferably used for the exposure.

The development step will be explained below. The exposed precursor is rubbed in the presence of water or a liquid obtained by adding a surfactant to water (hereinafter called a developer), to remove the silicone rubber layer in the exposed area. The friction treatment can be, for example, (i) a method of wiping the precursor surface with a nonwoven fabric, absorbent cotton, cloth, sponge or the like impregnated with a developer, (ii) a method of pretreating the precursor surface with a developer and subsequently rubbing with a rotary brush while showering with tap water or the like, (iii) a method of jetting the precursor surface with high-pressure cold water, hot water or steam, and so on.

Before development, the precursor may be immersed in a pre-treatment liquid for a certain time as pretreatment. Examples of the pre-treatment liquid include water, a liquid obtained by adding a polar solvent such as an alcohol, ketone ester or carboxylic acid to water, a liquid obtained by adding a polar solvent to at least one solvent such as an aliphatic hydrocarbon or aromatic hydrocarbon, or a polar solvent. Further, to the abovementioned developer composition, a publicly known surfactant can also be freely added. As the surfactant, a surfactant that keeps the pH of the aqueous solution thereof in a range from 5 to 8 is preferred in view of safety and cost of waste disposal. It is preferred that the content of the surfactant accounts for 10 wt % or less of the developer. Such a developer is preferred in view of high safety and economy such as cost of waste disposal. Further, it is preferred to use a glycol compound or glycol ether compound as a main component and it is more preferred that an amine compound is made to exist together.

As the pre-treatment liquid and the developer, the pre-treatment liquids and developers described in JP63-179361A, JP4-163557A, JP4-343360A, JP9-34132A, and Japanese patent No. 3716429 can be used. Specific examples of the pre-treatment liquid include PP-1, PP-3, PP-F, PP-FII, PTS-1, PH-7N, CP-1, NP-1, DP-1 (respectively produced by Toray Industries, Inc.), etc.

Further, for the purpose of enhancing the visibility of the image area and the measurement accuracy of halftone dots, a dye such as Crystal Violet, Vitoria Pure Blue or Astrazon Red can also be added to any of these developers, to dye the ink acceptable layer of the image area simultaneously with development. Furthermore, a liquid obtained by adding any of the abovementioned dyes can also be used for dyeing after development.

Some or all of the abovementioned development step can also be performed automatically using an automatic processor. As the automatic processor, a device composed of a development unit only, a device provided with a pre-treatment unit and a development unit in this order, a device provided with a pre-treatment unit, a development unit and a post-treatment unit in this order, a device provided with a pre-treatment unit, a development unit, a post-treatment and a water washing unit in this order, and the like can be used. Specific examples of the automatic processors include TWL-650 series, TWL-860 series, TWL-1160 series (respectively produced by Toray Industries, Inc.), and automatic processors disclosed in JP4-2265A, JP5-2272A, JP5-6000A, etc. Any one of them can be used alone or two or more of them can also be used together.

In the case where developed waterless lithographic printing plates are stacked to be stored, it is preferred to keep synthetic paper placed between the plates for the purpose of protecting the plate surfaces.

EXAMPLES

This invention is explained below in more detail in reference to examples.

[Production of a Non-Photosensitive Particle Dispersion]

A liquid obtained by mixing methyl ethyl ketone (80 wt %) and non-photosensitive particles (20 wt %) was dispersed by a beads mill "Star Mill" MINI CER (produced by Ashizawa Finetech Ltd.) packed with zirconia beads (0.3 mm dia.) at room temperature, to obtain a non-photosensitive particle dispersion.

[Evaluation Methods in Respective Examples and Comparative Examples]

(1) CV Value of Non-Photosensitive Particles

A sample obtained by depositing a small amount of non-photosensitive particles of a powder (without solvent) on a slide glass was photographed as an image by a digital camera "DXM 1200F (produced by Nikon Corporation) connected with an optical microscope "ECLIPSE" L200 (produced by Nikon Corporation, transmission mode, objective lens "CFI LU Plan Apo EPI" 150× (produced by Nikon Corporation)) (overall magnification on the monitor 3000×), and the average particle size and the standard deviation of the non-photosensitive particles were measured using image analysis and measurement software "WinROOF" (produced by Mitani Corporation). The CV value was calculated from the following formula.

$$\text{CV value}[\%]=(\text{Standard deviation}/\text{Average particle size})\times 100$$

(2) Observation of a Directly Imageable Lithographic Printing Plate Precursor with a TEM A sample was prepared, by an ultrathin section method, from a directly imageable waterless lithographic printing plate precursor not yet irradiated with a laser beam, and using a transmission electron microscope, H-1700FA (produced by Hitachi), the heat sensitive layer and the silicone rubber layer of the directly imageable waterless lithographic printing plate precursor were observed at an accelerating voltage of 100 kV and at a magnification of 2000× (8000× for observing liquid globules). The average layer thickness of the heat sensitive layer, the average particle size of the non-photosensitive particles, the occupying rate of the non-photosensitive particles at any horizontal plane, the area rate of layer thickness reduced regions to the surface of the heat sensitive layer, the area rate of layer inclined regions to the surface of the heat sensitive layer, the number and average diameter of liquid globules, and the average layer thickness of the silicone rubber layer were measured by the methods described below.

(2-1) Average Layer Thickness of a Heat Sensitive Layer

On the TEM photo showing a vertical cross section of a directly imageable waterless lithographic printing plate precursor obtained by an ultrathin section method, the layer thicknesses of the heat sensitive layer in the smooth portions free from the non-photosensitive particles (10 places selected at random) were measured, and the number average value was obtained as the average layer thickness of the heat sensitive layer.

(2-2) Average Particle Size of Non-Photosensitive Particles and the Occupying Rate of Non-Photosensitive Particles at any Horizontal Plane From the three-dimensional information of the horizontal cross sections of a directly imageable waterless lithographic printing plate precursor obtained by a continuous (ultrathin) section method, the average particle size of the non-photosensitive particles and the occupying rate of the non-photosensitive particles at any horizontal plane were calculated. The particle sizes of 50 non-photosensitive particles (the diameters of 50 equivolume spheres) were measured, and the number average value was employed as the average particle size. Further, the rate of the non-photosensitive particles occupying a unit area was employed as the occupying rate of the non-photosensitive particles at any horizontal plane (area %).

(Example of Calculating the Occupying Rate of Non-Photosensitive Particles at any Horizontal Plane)

Overall horizontal cross section: 100 $\mu m^2$

Number of non-photosensitive particles: 20

Average particle size of the non-photosensitive particles: 1 μm (radius: 0.5 μm)

$$\text{Occupying rate of the non-photosensitive particles}=100\times\pi(0.5[\mu m])^2\times 20[pcs]/100[\mu m^2]=15.7 \text{ [area \%]}$$

(2-3) Area Rate of Layer Thickness Reduced Regions to the Surface of the Heat Sensitive Layer The three-dimensional information of the vertical cross sections and the horizontal cross sections of a directly imageable waterless lithographic printing plate precursor obtained by a continuous (ultrathin) section method was analyzed using existing three-dimensional display/analysis software, to measure the area rate of the layer thickness reduced regions reduced to 0.1 μm or smaller in the layer thickness of the heat sensitive layer from the surface of the heat sensitive layer on the side facing the silicone rubber layer, to the surface of the heat sensitive layer.

(2-4) Area Rate of Layer Inclined Regions to the Surface of the Heat Sensitive Layer The three-dimensional information of the vertical cross sections and horizontal cross sections of a directly imageable waterless lithographic printing plate precursor obtained by a continuous (ultrathin) section method was analyzed using existing three-dimensional display/analysis software, to measure the area rate of the at least partially continuous planar and layer inclined regions each having a gradient of 10 degrees or larger and configuring a swelling structure, to the surface of the heat sensitive layer.

(2-5) Number of Liquid Globules

In the three-dimensional information of horizontal cross sections of a directly imageable waterless lithographic printing plate precursor obtained by a continuous (ultrathin) section method, the total number of the liquid globules (diameter 0.01 μm or larger) in 0.5 $\mu m^3$ (1 μm long×1 μm wide×0.5 μm deep (depth from the interface with the silicone rubber layer)) of the heat sensitive layer in the portion where non-photosensitive particles are not present in a depth of 0.5 μm from the interface with the silicone rubber layer was calculated. With regard to the liquid globules on the line for demarcating the observation area, a liquid globule, one half or more volume of which is located within the observation region, was counted as one, and a liquid globule, less than one half volume of which is located within the observation region, was not counted.

(2-6) Average Diameter of Liquid Globules

The average diameter of liquid globules was calculated from the three-dimensional information of horizontal cross sections of a water imageable waterless lithographic printing plate precursor obtained by a continuous (ultrathin) section method. The diameters of 50 liquid globules selected at random from the heat sensitive layer in the portion where the non-photosensitive particles were not present were measured, and the number average value was employed as the average diameter.

(2-7) Average Layer Thickness of a Silicone Rubber Layer

On the TEM photo showing a vertical cross section of a directly imageable waterless lithographic printing plate precursor obtained by an ultrathin section method, the layer thicknesses of the silicone rubber layer (at 10 places selected at random) on the heat sensitive layer in a smooth portion where the non-photosensitive particles were not present were measured, and the number average value was employed as the average layer thickness of the silicone rubber layer.

(3) Analysis of Liquid Globules (3-1) Pretreatment and Gas Chromatography/Mass Spectrometry A directly imageable waterless lithographic printing plate precursor cut to 1 $cm^2$ (1×1 cm square) was placed in a glass container to be heated, and while nitrogen gas was fed (flow rate 100 ml/min), the glass container was heated at 320° C. for 20 minutes. The gas generated in this case was collected in an adsorbing tube (for JTD505II). The adsorbing tube was heated at 320° C. for 15 minutes, and the thermally desorbed gas component was analyzed by gas chromatography/mass spectrometry. The glass container per se was analyzed under the same conditions, to obtain a blank.

(3-2) Conditions of Gas Chromatography/Mass Spectrometry

Thermally desorbing device: JTD505II (produced by Japan Analytical Industry Co., Ltd.)

Secondary thermally desorbing temperature: 340° C., 180 seconds

Gas chromatograph: HP5980 (produced by Hewlett Packard)

Column: DB-5 (produced by J&W)

30 m×0.25 mm ID, film thickness 0.5 μm, U.S. Pat. No. 7,119,416H

Column temperature: 40° C. (4 min)→340° C. (heating rate: 10° C./min)

Mass spectrometer: JMS-SX102A mass spectrometer (produced by JEOL Ltd.)

Ionization method: EI

Scanning range: m/z 10 to 500 (1.2 sec/scan)

TIC mass range: m/z 29 to 500

(3-3) Preparation of Calibration Curve

A solvent with a solubility parameter of 17.0 $(MPa)^{1/2}$ or less used in each of examples and comparative examples was placed in a measuring flask, to prepare standard solutions (3375 μg/ml, 5095 μg/ml, 30265 μg/ml). From these standard solutions, 1 μg each was taken and analyzed under the same conditions as those of the sample. From the relationship between the absolute amounts of the injected solvent with a solubility parameter of 17.0 $(MPa)^{1/2}$ or less and the peak areas of the total ion chromatogram of gas chromatography/mass spectrometry, a calibration curve was prepared.

(4) Evaluation of Sensitivity and Anti-Blister Performance (4-1) Evaluation of Anti-Blister Maximum Exposure Value An obtained directly imageable waterless lithographic printing plate precursor (1030×800 mm) was set in an exposure machine "Plate Rite" 8800E (produced by Dainippon Screen Mfg. Co., Ltd.), and the entire surface thereof was exposed at an irradiation energy of 80 $mJ/cm^2$. The surface of the full surface exposed plate discharged from the exposure machine was visually observed to evaluate whether or not the silicone rubber layer separated. Whenever the separation of the silicone rubber layer was not observed, the irradiation energy was increased by 10 $mJ/cm^2$, for evaluation till the separation of the silicone rubber layer was observed. The maximum exposure value at which the separation of the silicone rubber layer was not observed was employed as the anti-blister maximum exposure value.

(4-2) Evaluation of Solid Print Reproducing Minimum Exposure Value

The full surface exposed plate obtained by the method described in the above (4-1) was developed using an automatic processor "TWL-1160F" (produced by Toray Industries, Inc.) without the pre-treatment liquid, using tap water (room temperature) as the developer and tap water (room temperature) as the post-treatment liquid at a plate feed rate of 80 cm/min. The obtained printing plate was visually observed, and the minimum exposure value at which the silicone rubber layer in the entire exposed area could be perfectly peeled was employed as the solid print reproducing minimum exposure value.

(4-3) Latitude

The anti-blister maximum exposure value and the solid print reproducing minimum exposure value obtained by the abovementioned methods were used to calculate the latitude from the following formula.

$$\text{Latitude}(mJ/cm^2)=\text{Anti-blister maximum exposure value}(mJ/cm^2)-\text{Solid print reproducing minimum exposure value}(mJ/cm^2)$$

(5) Evaluation of Scumming of the Non-Image Area

A directly imageable waterless lithographic printing plate precursor was set in a printing machine "OLIVER" 466SD (produced by Sakurai Graphic Systems Corp.), and printing was performed onto wood-free paper using an ink, "Aqualess Echo" (registered trademark) NEO (produced by Toyo Ink Co., Ltd.) at a precursor surface temperature of 27° C. and at a printing speed of 10000 sheets/hour. The obtained print was visually observed. A case where no scumming was obtained was evaluated as acceptable (expressed by a circle); a case where scumming was partially observed was evaluated as unacceptable (expressed by a triangle); and a case where scumming was generally observed was evaluated as unacceptable (expressed by a cross).

(6) Evaluation of the Dispersion Stability of Non-Photosensitive Particles in a Heat Sensitive Layer Composition Solution A heat sensitive layer composition solution having non-photosensitive particles dispersed therein was placed in a closed container and allowed to stand for 1 hour, to evaluate the dispersion stability of the non-photosensitive particles in the heat sensitive layer composition solution. One hour later, the container was slowly turned upside down. A case where the non-photosensitive particles were not observed to settle at the bottom was evaluated as acceptable in dispersion stability (expressed by a circle), and a case where the non-photosensitive particles were observed to settle was evaluated as unacceptable (expressed by a cross).

Example 1

A degreased aluminum substrate with a thickness of 0.24 mm (produced by Mitsubishi Aluminum Co., Ltd.) was coated with the following heat insulating layer composition solution, and the coating was dried at 200° C. for 90 seconds to form a 6.0 μm thick heat insulating layer. Meanwhile, the heat insulating layer composition solution was obtained by stirring and mixing the following components at room temperature.

[Heat Insulating Layer Composition Solution]

(a) Polymer having active hydrogen: Epoxy resin "Epikote" (registered trademark) 1010 (produced by Japan Epoxy Resin K.K.): 35 parts by weight (b) Polymer having active hydrogen: Polyurethane "Sanprene" (registered trademark) LQ-T1331D (produced by Sanyo Chemical Industries Ltd.), solid concentration 20 wt %: 375 parts by weight (c) Aluminum chelate: "Alumichelate" ALCH-TR (produced by Kawaken Fine Chemicals Co., Ltd.): 10 parts by weight (d) Leveling agent: "Disparlon" (registered trademark) LC951 (produced by Kusumoto Chemical Co., Ltd.), solid content 10 wt %): 1 part by weight (e) Titanium oxide: N,N-dimethylformamide dispersion of "Tipaque" (registered trademark) CR-50 (produced by Ishihara Sangyo Kaisha, Ltd.) (titanium oxide 50 wt %): 60 parts by weight (f) N,N-dimethylformamide: 730 parts by weight (g) Methyl ethyl ketone: 250 parts by weight Then, the aforementioned heat insulating layer was coated with the following heat sensitive composition solution −1, and the coating was heated at 120° C. for 30 seconds to form a heat sensitive layer. Meanwhile, the heat sensitive layer composition solution −1 was obtained by stirring and mixing the following components at room temperature.

[Heat Sensitive Layer Composition Solution −1]

(a) Infrared absorbing dye: "PROJET" 825LDI (produced by Avecia) . . . 6.6 parts by weight (b) Organic complex compound: Titanium di-n-butoxide-bis (acetylacetonate): "Nacem" (registered trademark) Titan (produced by Nippon Kagaku Sangyo Co., concentration 73 wt %, containing 27 wt % of n-butanol (boiling point 117° C., solubility parameter 23.3 $(MPa)^{1/2}$) as a solvent) . . . 7.3 parts by weight (c) Phenol formaldehyde novolac resin: "Sumilite Resin" (registered trademark) PR50731 (produced by Sumitomo Bakelite Co., Ltd., heat softening point 95° C.) . . . 49.5 parts by weight (d) Polyurethane: "NIPPOLAN" (registered trademark) 5196 (produced by Nippon Polyurethane Industry Co., Ltd., concentration 30 wt %, containing 35 wt % of methyl ethyl ketone (boiling point 80° C., solubility parameter 19.0 $(MPa)^{1/2}$) and 35 wt % of cyclohexanone (boiling point 155°, solubility parameter 20.3 $(MPa)^{1/2}$) as solvents) . . . 13.2 parts by weight (e) Non-photosensitive crosslinked acrylic resin particle dispersion: "LIOSPHERE" (registered trademark) RSP3021 (produced by Toyo Ink Co., Ltd., average particle size 0.6 μM, CV value 18.9%, specific gravity 1.20, concentration 20 wt %, containing 80 wt % of methyl ethyl ketone as a dispersion medium) . . . 15.0 parts by weight (f) Tetrahydrofuran (boiling point 66° C., solubility parameter 18.6 $(MPa)^{1/2}$) . . . 1401.8 parts by weight (g) Liquid having a solubility parameter of 17.0 $(MPa)^{1/2}$ or less and a boiling point in a range from 210 to 270° C.: Aliphatic saturated hydrocarbon "Isopar" (registered trademark) M (produced by Esso Kagaku K.K., boiling point 223 to 254° C., solubility parameter 14.7 $(MPa)^{1/2}$) . . . 6.6 parts by weight The solid concentration of the heat sensitive layer composition solution was 4.6 wt %, and the content of the liquid having a solubility parameter of 17.0 $(MPa)^{1/2}$ or less and a boiling point in a range from 210 to 270° C. was 0.44 wt %.

Subsequently, the aforementioned heat sensitive layer was coated with the following silicone rubber layer composition solution produced immediately before the coating, and the coating was heated at 130° C. for 90 seconds, to form a 1.8 μm thick silicone rubber layer, for obtaining a directly imageable waterless lithographic printing plate precursor.

[Silicone Rubber Layer Composition Solution]

The following components (a) through (c) were dispersed by a beads mill, "Star Mill" (registered trademark) MINI CER (produced by Ashizawa Finetech Ltd.) packed with zirconia beads (0.3 mm dia.), to obtain a Milori blue dispersion. On the other hand, the following components (d) through (h) were mixed to obtain a diluted silicone solution. While the Milori blue dispersion was stirred, the diluted silicone solution was added, and the mixture was sufficiently stirred till the components were homogenized. Bubbles were naturally removed from the obtained solution.

(a) MILORI BLUE N650 (produced by Dainichi Seika Color & Chemicals Mfg. Co., Ltd.): 4 parts by weight
(b) "Plenact" (registered trademark) KR-TTS (produced by Ajinomoto Fine Techno Co., Inc.): 1.5 parts by weight
(c) "Isopar" G (produced by Esso Kagaku K.K.): 83 parts by weight
(d) α,ω-divinylpolydimethylsiloxane: "DMS" V52 (weight average molecular weight 155000 produced by GELEST Inc.): 83 parts by weight
(e) Methylhydrogensiloxane "SH" 1107 (produced by Toray Dow Corning K.K.): 4 parts by weight
(f) Vinyltris(methylethylketoximino)silane: 3 parts by weight
(g) Platinum catalyst "SRX" 212 (produced by Toray Dow Corning K.K.): 6 parts by weight
(h) "Isopar" E (Esso Kagaku K.K.): 817 parts by weight The obtained directly imageable waterless lithographic printing plate precursor was observed with a TEM according to the aforementioned method. The average particle size of the observed non-photosensitive particles in the cross sections of the heat sensitive layer was 0.6 μm, and the average layer thickness of the heat sensitive layer in the portion free from the non-photosensitive particles was 0.5 μm. The occupying rate of the non-photosensitive particles at any horizontal plane was 5.0 area %. Further, in 0.5 $\mu m^3$ of the heat sensitive layer in the portion where the non-photosensitive particles were not present, 42 liquid globules were observed, and the average diameter of the liquid globules was 0.15 μm. The liquid globules were analyzed, and the presence of a liquid derived from "Isopar" M and having a boiling point in a range from 223 to 254° C. was confirmed. The amount of the liquid derived from "Isopar" M and generated as a gas was 5.34 μg.

The anti-blister maximum exposure value evaluated by the aforementioned method was 160 $mJ/cm^2$, and the solid print reproducing minimum exposure value was 140 $mJ/cm^2$, to show there was a latitude of 20 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 2

A directly imageable waterless lithographic printing plate precursor was obtained as described in Example 1, except that the heat sensitive layer composition solution -1 was changed to the following heat sensitive layer composition solution -2.

[Heat Sensitive Layer Composition Solution -2]

(a) "PROJET" 825LDI: 6.6 parts by weight
(b) "Nacem" Titan: 7.3 parts by weight
(c) "Sumilite Resin" PR50731: 49.5 parts by weight
(d) "Nippolan" 5196: 13.2 parts by weight
(e) Non-photosensitive crosslinked acrylic resin particle dispersion: "LIOSPHERE" RSP3015 (produced by Toyo Ink Co., Ltd., average particle size 1.4 μm, CV value 3.5%, specific gravity 1.20, concentration 20 wt %, containing 80 wt % of methyl ethyl ketone as a dispersion medium): 35.0 parts by weight
(f) Tetrahydrofuran: 1381.8 parts by weight
(g) "Isopar" M: 6.6 parts by weight The solid concentration of the heat sensitive layer composition solution was 4.8 wt %, and the content of the liquid having a solubility parameter of 17.0 $(MPa)^{1/2}$ or less and a boiling point in a range from 210 to 270° C. was 0.44 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 0.5 μm. The occupying rate of the non-photosensitive particles at any horizontal plane was 5.0 area %. Further, the area rate of the layer thickness reduced regions to the surface of the heat sensitive layer was 5.0 area %, and the area rate of the layer inclined regions to the surface of the heat sensitive layer was 4.6 area %. Furthermore, in 0.5 $\mu m^3$ of the heat sensitive layer in the portion where the non-photosensitive particles were not present, 44 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 5.39 μg.

The anti-blister maximum exposure value evaluated by the aforementioned method was 180 $mJ/cm^2$, and the solid print reproducing minimum exposure value was 140 $mJ/cm^2$, to show there was a latitude of 40 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 3

A directly imageable waterless lithographic printing plate precursor was obtained as described in Example 1, except that the heat sensitive layer composition solution -1 was changed to the following heat sensitive layer composition solution -3.

[Heat Sensitive Layer Composition Solution -3]

(a) "PROJET" 825LDI: 6.6 parts by weight
(b) "Nacem" Titan: 7.3 parts by weight
(c) "Sumilite Resin" PR50731: 49.5 parts by weight
(d) "Nippolan" 5196: 13.2 parts by weight (e) Non-photosensitive crosslinked acrylic resin particle dispersion: "LIOSPHERE" RSP3031 (produced by Toyo Ink Co., Ltd., average particle size 1.7 μm, CV value 2.9%, specific gravity 1.20, concentration 20 wt %, containing 80 wt % of methyl ethyl ketone as a dispersion medium): 42.5 parts by weight (f) Tetrahydrofuran: 1374.3 parts by weight (g) "Isopar" M: 6.6 parts by weight The solid concentration of the heat sensitive layer composition solution was 4.9 wt %, and the content of the liquid having a solubility parameter of 17.0 $(MPa)^{1/2}$ or less and a boiling point in a range from 210 to 270° C. was 0.44 wt %.

Evaluation was made as described in Example 1. The average particle size of the observed non-photosensitive particles in the cross sections of the heat sensitive layer was 1.7 μm, and the average layer thickness of the heat sensitive layer in the portion free from the non-photosensitive particles was 0.5 μM. Further, the occupying rate of the non-photosensitive particles at any horizontal plane was 5.0 area %. Furthermore, the area rate of the layer thickness reduced regions to the surface of the heat sensitive layer was 5.0 area %, and the area rate of the layer inclined regions to the surface of the heat sensitive layer was 4.2 area %. Moreover, in 0.5 $μm^3$ of the heat sensitive layer in the portion where the non-photosensitive particles were not present, 41 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 5.30 μg.

The anti-blister maximum exposure value evaluated by the aforementioned method was 180 $mJ/cm^2$, and the solid print reproducing minimum exposure value was 140 $mJ/cm^2$, to show there was a latitude of 40 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 4

A directly imageable waterless lithographic printing plate precursor was obtained as described in Example 1, except that the heat sensitive layer composition solution -1 was changed to the following heat sensitive layer composition solution -4.

[Heat Sensitive Layer Composition Solution -4]

(a) "PROJET" 825LDI: 6.6 parts by weight (b) "Nacem" Titan: 7.3 parts by weight (c) "Sumilite Resin" PR50731: 49.5 parts by weight (d) "Nippolan" 5196: 13.2 parts by weight (e) Non-photosensitive crosslinked acrylic resin particle dispersion: "LIOSPHERE" RSP3019 (produced by Toyo Ink Co., Ltd., average particle size 2.1 μm, CV value 2.3%, specific gravity 1.20, concentration 20 wt %, containing 80 wt % of methyl ethyl ketone as a dispersion medium): 52.5 parts by weight (f) Tetrahydrofuran: 1364.3 parts by weight (g) "Isopar" M: 6.6 parts by weight The solid concentration of the heat sensitive layer composition solution was 5.1 wt %, and the content of the liquid having a solubility parameter of 17.0 $(MPa)^{1/2}$ or less and a boiling point in a range from 210 to 270° C. was 0.44 wt %.

Evaluation was made as described in Example 1. The average particle size of the observed non-photosensitive particles in the cross sections of the heat sensitive layer was 2.1 μm, and the average layer thickness of the heat sensitive layer in the portion free from the non-photosensitive particles was 0.5 μm. Further, the occupying rate of the non-photosensitive particles at any horizontal plane was 5.0 area %. Furthermore, the area rate of the layer thickness reduced regions to the surface of the heat sensitive layer was 5.0 area %, and the area rate of the layer inclined regions to the surface of the heat sensitive layer was 3.6 area %. Moreover, in 0.5 $μm^3$ of the heat sensitive layer in the portion where the non-photosensitive particles were not present, 40 liquid globules were observed, and the average diameter of the liquid globules was 0.16 μM. The liquid globules were analyzed, and the presence of a liquid derived from "Isopar" M and having a boiling point in a range from 223 to 254° C. was confirmed, and the amount of the liquid derived from "Isopar" M and generated as a gas was 5.48 μg.

The anti-blister maximum exposure value evaluated by the aforementioned method was 180 $mJ/cm^2$, and the solid print reproducing minimum exposure value was 140 $mJ/cm^2$, to show there was a latitude of 40 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 5

A directly imageable waterless lithographic printing plate precursor was obtained as described in Example 1, except that the heat sensitive layer composition solution -1 was changed to the following heat sensitive layer composition solution -5.

[Heat Sensitive Layer Composition Solution -5]

(a) "PROJET" 825LDI: 6.6 parts by weight (b) "Nacem" Titan: 7.3 parts by weight (c) "Sumilite Resin" PR50731: 49.5 parts by weight (d) "Nippolan" 5196: 13.2 parts by weight (e) Non-photosensitive crosslinked acrylic resin particle dispersion: "LIOSPHERE" RSP3009 (produced by Toyo Ink Co., Ltd., average particle size 2.6 μm, CV value 1.9%, specific gravity 1.20, concentration 20 wt %, containing 80 wt % of methyl ethyl ketone as a dispersion medium): 65.0 parts by weight (f) Tetrahydrofuran: 1351.8 parts by weight (g) "Isopar" M: 6.6 parts by weight The solid concentration of the heat sensitive layer composition solution was 5.2 wt %, and the content of the liquid having a solubility parameter of 17.0 $(MPa)^{1/2}$ or less and a boiling point in a range from 210 to 270° C. was 0.44 wt %.

Evaluation was made as described in Example 1. The average particle size of the observed non-photosensitive particles in the cross sections of the heat sensitive layer was 2.6 μM, and the average layer thickness of the heat sensitive layer in the portion free from the non-photosensitive particles was 0.5 μm. Further, the occupying rate of the non-photosensitive particles at any horizontal plane was 5.0 area %. Furthermore, the area rate of the layer thickness reduced regions to the surface of the heat sensitive layer was 5.0 area %, and the area rate of the layer inclined regions to the surface of the heat sensitive layer was 3.1 area %. Moreover, in 0.5 $μm^3$ of the heat sensitive layer in the portion where the non-photosensitive particles were not present, 46 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 5.56 μg.

The anti-blister maximum exposure value evaluated by the aforementioned method was 180 $mJ/cm^2$, and the solid print reproducing minimum exposure value was 140 $mJ/cm^2$, to show there was a latitude of 40 $mJ/cm^2$. The scumming of the non-image area was evaluated according to the aforementioned method, and scumming was observed on the entire surface of the print. The dispersion stability of the non-photosensitive particles in the heat sensitive layer composition solution was evaluated according to the aforementioned method, and the settlement of the non-photosensitive particles was not observed.

Example 6

A directly imageable waterless lithographic printing plate precursor was obtained as described in Example 1, except that the heat sensitive layer composition solution –1 was changed to the following heat sensitive layer composition solution –6.

[Heat Sensitive Layer Composition Solution –6]

(a) "PROJET" 825LDI: 13.3 parts by weight
(b) "Nacem" Titan: 14.6 parts by weight
(c) "Sumilite Resin" PR50731: 99.4 parts by weight
(d) "Nippolan" 5196: 26.5 parts by weight
(e) Non-photosensitive silica particle dispersion: "Hipresica" (registered trademark) UF-N3N (produced by Ube Nitto Kasei Co., Ltd., average particle size 1.1 μm, CV value 3.6%, specific gravity 2.10, concentration 20 wt %, containing 80 wt % of methyl ethyl ketone as a dispersion medium): 48.2 parts by weight
(f) Tetrahydrofuran: 1284.9 parts by weight
(g) "Isopar" M: 13.3 parts by weight The solid concentration of the heat sensitive layer composition solution was 9.4 wt %, and the content of the liquid having a solubility parameter of 17.0 $(MPa)^{1/2}$ or less and a boiling point in a range from 210 to 270° C. was 0.88 wt %.

Evaluation was made as described in Example 1. The average particle size of the observed non-photosensitive particles in the cross sections of the heat sensitive layer was 1.1 μm, and the average layer thickness of the heat sensitive layer in the portion free from the non-photosensitive particles was 1.0 μm. Further, the occupying rate of the non-photosensitive particles at any horizontal plane was 5.0 area %. Furthermore, in 0.5 $μm^3$ of the heat sensitive layer in the portion where the non-photosensitive particles were not present, 38 liquid globules were observed, and the average diameter of the liquid globules was 0.16 μm. The liquid globules were analyzed, and the presence of a liquid derived from "Isopar" M and having a boiling point in a range from 223 to 254° C. was confirmed, and the amount of the liquid derived from "Isopar" M and generated as a gas was 10.72 μg.

The anti-blister maximum exposure value evaluated by the aforementioned method was 160 $mJ/cm^2$, and the solid print reproducing minimum exposure value was 130 $mJ/cm^2$, to show there was a latitude of 30 $mJ/cm^2$. The scumming of the non-image area was evaluated according to the aforementioned method, and scumming was not observed in the print. The dispersion stability of the non-photosensitive particles in the heat sensitive layer composition solution was evaluated according to the aforementioned method, and the settlement of the non-photosensitive particles was observed.

Example 7

A directly imageable waterless lithographic printing plate precursor was obtained as described in Example 1, except that the heat sensitive layer composition solution –1 was changed to the following heat sensitive layer composition solution –7.

[Heat Sensitive Layer Composition Solution –7]

(a) "PROJET" 825LDI: 13.3 parts by weight
(b) "Nacem" Titan: 14.7 parts by weight
(c) "Sumilite Resin" PR50731: 100.0 parts by weight
(d) "Nippolan" 5196: 26.7 parts by weight
(e) Non-photosensitive acrylic resin particle dispersion: "LIOSPHERE" RSP3015: 35.0 parts by weight
(f) Tetrahydrofuran: 1297.0 parts by weight
(g) "Isopar" M: 13.3 parts by weight The solid concentration of the heat sensitive layer composition solution was 9.3 wt %, and the content of the liquid having a solubility parameter of 17.0 $(MPa)^{1/2}$ or less and a boiling point in a range from 210 to 270° C. was 0.89 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 1.0 μm. Further, the occupying rate of the non-photosensitive particles at any horizontal plane was 5.0 area %. Furthermore, the area rate of the layer thickness reduced regions to the surface of the heat sensitive layer was 4.6 area %, and the area rate of the layer inclined regions to the surface of the heat sensitive layer was 4.1 area %. Moreover, in 0.5 $μm^3$ of the heat sensitive layer in the portion where the non-photosensitive particles were not present, 42 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 10.63 μg.

The anti-blister maximum exposure value evaluated by the aforementioned method was 170 $mJ/cm^2$, and the solid print reproducing minimum exposure value was 130 $mJ/cm^2$, to show there was a latitude of 40 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 8

A directly imageable waterless lithographic printing plate precursor was obtained as described in Example 1, except that the heat sensitive layer composition solution –1 was changed to the following heat sensitive layer composition solution –8.

[Heat Sensitive Layer Composition Solution –8]

(a) "PROJET" 825LDI: 13.3 parts by weight
(b) "Nacem" Titan: 14.7 parts by weight
(c) "Sumilite Resin" PR50731: 100.0 parts by weight
(d) "Nippolan" 5196: 26.7 parts by weight
(e) Non-photosensitive acrylic resin particle dispersion: "LIOSPHERE" RSP3031: 42.5 parts by weight
(f) Tetrahydrofuran: 1289.5 parts by weight
(g) "Isopar" M: 13.3 parts by weight The solid concentration of the heat sensitive layer composition solution was 9.4 wt %, and the content of the liquid having a solubility parameter of 17.0 $(MPa)^{1/2}$ or less and a boiling point in a range from 210 to 270° C. was 0.89 wt %.

Evaluation was made as described in Example 1. The average particle size of the observed non-photosensitive particles in the cross sections of the heat sensitive layer was 1.7 μm, and the average layer thickness of the heat sensitive layer in the portion free from the non-photosensitive particles was 1.0 μm. Further, the occupying rate of the non-photosensitive particles at any horizontal plane was 5.0 area %. Furthermore, the area rate of the layer thickness reduced regions to the surface of the heat sensitive layer was 5.0 area %, and the area rate of the layer inclined regions to the surface of the heat sensitive layer was 4.8 area %. Moreover, in 0.5 $\mu m^3$ of the heat sensitive layer in the portion where the non-photosensitive particles were not present, 40 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 10.75 μg.

The anti-blister maximum exposure value evaluated by the aforementioned method was 170 mJ/cm$^2$, and the solid print reproducing minimum exposure value was 130 mJ/cm$^2$, to show there was a latitude of 40 mJ/cm$^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 9

A directly imageable waterless lithographic printing plate precursor was obtained as described in Example 1, except that the heat sensitive layer composition solution −1 was changed to the following heat sensitive layer composition solution −9.

[Heat Sensitive Layer Composition Solution −9]

(a) "PROJET" 825LDI: 16.0 parts by weight
(b) "Nacem" Titan: 17.6 parts by weight
(c) "Sumilite Resin" PR50731: 120.0 parts by weight
(d) "Nippolan" 5196: 32.0 parts by weight
(e) Non-photosensitive acrylic resin particle dispersion: "LIOSPHERE" RSP3015: 35.0 parts by weight
(f) Tetrahydrofuran: 1263.4 parts by weight
(g) "Isopar" M: 16.0 parts by weight The solid concentration of the heat sensitive layer composition solution was 11.0 wt %, and the content of the liquid having a solubility parameter of 17.0 (MPa)$^{1/2}$ or less and a boiling point in a range from 210 to 270° C. was 1.07 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 1.2 μm. Further, the occupying rate of the non-photosensitive particles at any horizontal plane was 5.0 area %. Furthermore, in 0.5 $\mu m^3$ of the heat sensitive layer in the portion where the non-photosensitive particles were not present, 40 liquid globules were observed, and the average diameter of the liquid globules was 0.16 μm. The liquid globules were analyzed, and the presence of a liquid derived from "Isopar" M and having a boiling point in a range from 223 to 254° C. was confirmed, and the amount of the liquid derived from "Isopar" M and generated as a gas was 12.84 μg.

The anti-blister maximum exposure value evaluated by the aforementioned method was 150 mJ/cm$^2$, and the solid print reproducing minimum exposure value was 120 mJ/cm$^2$, to show there was a latitude of 30 mJ/cm$^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 10

A directly imageable waterless lithographic printing plate precursor was obtained as described in Example 1, except that the heat sensitive layer composition solution −1 was changed to the following heat sensitive layer composition solution −10.

[Heat Sensitive Composition Solution −10]

(a) "PROJET" 825LDI: 16.0 parts by weight
(b) "Nacem" Titan: 17.6 parts by weight
(c) "Sumilite Resin" PR50731: 120.0 parts by weight
(d) "Nippolan" 5196: 32.0 parts by weight
(e) Non-photosensitive acrylic resin particle dispersion: "LIOSPHERE" RSP3031: 42.5 parts by weight
(f) Tetrahydrofuran: 1255.9 parts by weight
(g) "Isopar" M: 16.0 parts by weight The solid concentration of the heat sensitive layer composition solution was 11.1 wt %, and the content of the liquid having a solubility parameter of 17.0 (MPa)$^{1/2}$ or less and a boiling point in a range from 210 to 270° C. was 1.07 wt %.

Evaluation was made as described in Example 1. The average particle size of the observed non-photosensitive particles in the cross sections of the heat sensitive layer was 1.7 μm, and the average layer thickness of the heat sensitive layer in the portion free from the non-photosensitive particles was 1.2 μm. Further, the occupying rate of the non-photosensitive particles at any horizontal plane was 5.0 area %. Furthermore, the area rate of the layer thickness reduced regions to the surface of the heat sensitive layer was 4.6 area %, and the area rate of the layer inclined regions to the surface of the heat sensitive layer was 4.2 area %. Moreover, in 0.5 $\mu m^3$ of the heat sensitive layer in the portion where the non-photosensitive particles were not present, 39 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 12.99 μg.

The anti-blister maximum exposure value evaluated by the aforementioned method was 160 mJ/cm$^2$, and the solid print reproducing minimum exposure value was 120 mJ/cm$^2$, to show there was a latitude of 40 mJ/cm$^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 11

A directly imageable waterless lithographic printing plate precursor was obtained as described in Example 1, except that the heat sensitive layer composition solution −1 was changed to the following heat sensitive layer composition solution −11.

[Heat Sensitive Layer Composition Solution −11]

(a) "PROJET" 825LDI: 20.0 parts by weight
(b) "Nacem" Titan: 22.0 parts by weight
(c) "Sumilite Resin" PR50731: 150.3 parts by weight
(d) "Nippolan" 5196: 40.1 parts by weight (e) Non-photosensitive crosslinked styrene resin particle dispersion: "Chemisnow" SX130H (produced by Soken Chemical & Engineering Co., Ltd., average particle size 1.3 μm, CV value 5.0%, specific gravity 1.05, concentration 20 wt %, containing 80 wt % of methyl ethyl ketone as a dispersion medium): 28.5 parts by weight
(f) Tetrahydrofuran: 1219.0 parts by weight
(g) "Isopar" M: 20.0 parts by weight The solid concentration of the heat sensitive layer composition solution was 13.6 wt %, and the content of the liquid having a solubility parameter of 17.0 $(MPa)^{1/2}$ or less and a boiling point in a range from 210 to 270° C. was 1.34 wt %.

Evaluation was made as described in Example 1. The average particle size of the observed non-photosensitive particles in the cross sections of the heat sensitive layer was 1.3 μm, and the average layer thickness of the heat sensitive layer in the portion free from the non-photosensitive particles was 1.5 μm. Further, the occupying rate of the non-photosensitive particles at any horizontal plane was 5.0 area %. Furthermore, in 0.5 $μm^3$ of the heat sensitive layer in the portion where the non-photosensitive particles were not present, 41 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 16.21 μg.

The anti-blister maximum exposure value evaluated by the aforementioned method was 140 $mJ/cm^2$, and the solid print reproducing minimum exposure value was 120 $mJ/cm^2$, to show there was a latitude of 20 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 12

A directly imageable waterless lithographic printing plate precursor was obtained as described in Example 1, except that the heat sensitive layer composition solution −1 was changed to the following heat sensitive layer composition solution −12.

[Heat Sensitive Layer Composition Solution −12]
(a) "PROJET" 825LDI: 20.0 parts by weight
(b) "Nacem" Titan: 22.0 parts by weight
(c) "Sumilite Resin" PR50731: 150.0 parts by weight
(d) "Nippolan" 5196: 40.0 parts by weight
(e) Non-photosensitive crosslinked acrylic resin particle dispersion: "LIOSPHERE" RSP3015: 35.0 parts by weight
(f) Tetrahydrofuran: 1213.1 parts by weight
(g) "Isopar" M: 20.0 parts by weight The solid concentration of the heat sensitive layer composition solution was 13.7 wt %, and the content of the liquid having a solubility parameter of 17.0 $(MPa)^{1/2}$ or less and a boiling point in a range from 210 to 270° C. was 1.33 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 1.5 μm. Further, the occupying rate of the non-photosensitive particles at any horizontal plane was 5.0 area %. Furthermore, in 0.5 $μm^3$ of the heat sensitive layer in the portion where the non-photosensitive particles were not present, 41 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 16.17 μg.

The anti-blister maximum exposure value evaluated by the aforementioned method was 150 $mJ/cm^2$, and the solid print reproducing minimum exposure value was 120 $mJ/cm^2$, to show there was a latitude of 30 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 13

A directly imageable waterless lithographic printing plate precursor was obtained as described in Example 1, except that the heat sensitive layer composition solution −1 was changed to the following heat sensitive layer composition solution −13.

[Heat Sensitive Layer Composition Solution −13]
(a) "PROJET" 825LDI: 20.5 parts by weight
(b) "Nacem" Titan: 22.6 parts by weight
(c) "Sumilite Resin" PR50731: 153.8 parts by weight
(d) "Nippolan" 5196: 41.0 parts by weight
(e) Non-photosensitive crosslinked acrylic resin particle dispersion: "LIOSPHERE" RSP3015: 7.0 parts by weight
(f) Tetrahydrofuran: 1234.6 parts by weight
(g) "Isopar" M: 20.5 parts by weight The solid concentration of the heat sensitive layer composition solution was 13.6 wt %, and the content of the liquid having a solubility parameter of 17.0 $(MPa)^{1/2}$ or less and a boiling point in a range from 210 to 270° C. was 1.37 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 1.5 μm. Further, the occupying rate of the non-photosensitive particles at any horizontal plane was 1.0 area %. Furthermore, in 0.5 $μm^3$ of the heat sensitive layer in the portion where the non-photosensitive particles were not present, 40 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 16.59 μg.

The anti-blister maximum exposure value evaluated by the aforementioned method was 130 $mJ/cm^2$, and the solid print reproducing minimum exposure value was 120 $mJ/cm^2$, to show there was a latitude of 10 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 14

A directly imageable waterless lithographic printing plate precursor was obtained as described in Example 1, except that the heat sensitive layer composition solution −1 was changed to the following heat sensitive layer composition solution −14.

[Heat Sensitive Layer Composition Solution −14]

(a) “PROJET” 825LDI: 19.4 parts by weight
(b) “Nacem” Titan: 21.3 parts by weight
(c) “Sumilite Resin” PR50731: 145.1 parts by weight
(d) “Nippolan” 5196: 38.7 parts by weight
(e) Non-photosensitive crosslinked acrylic resin particle dispersion: “LIOSPHERE” RSP3015: 70.0 parts by weight
(f) Tetrahydrofuran: 1186.2 parts by weight
(g) “Isopar” M: 19.4 parts by weight The solid concentration of the heat sensitive layer composition solution was 13.7 wt %, and the content of the liquid having a solubility parameter of 17.0 $(MPa)^{1/2}$ or less and a boiling point in a range from 210 to 270° C. was 1.29 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 1.5 μm. Further, the occupying rate of the non-photosensitive particles at any horizontal plane was 10.0 area %. Furthermore, in 0.5 $\mu m^3$ of the heat sensitive layer in the portion where the non-photosensitive particles were not present, 42 liquid globules were observed, and the average diameter of the liquid globules was 0.15 μm. The liquid globules were analyzed, and the presence of a liquid derived from “Isopar” M and having a boiling point in a range from 223 to 254° C. was confirmed, and the amount of the liquid derived from “Isopar” M and generated as a gas was 15.65 μg.

The anti-blister maximum exposure value evaluated by the aforementioned method was 160 $mJ/cm^2$, and the solid print reproducing minimum exposure value was 130 $mJ/cm^2$, to show there was a latitude of 30 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 15

A directly imageable waterless lithographic printing plate precursor was obtained as described in Example 1, except that the heat sensitive layer composition solution −1 was changed to the following heat sensitive layer composition solution −15.

[Heat Sensitive Layer Composition Solution −15]

(a) “PROJET” 825LDI: 18.1 parts by weight
(b) “Nacem” Titan: 19.9 parts by weight
(c) “Sumilite Resin” PR50731: 135.5 parts by weight
(d) “Nippolan” 5196: 36.1 parts by weight
(e) Non-photosensitive crosslinked acrylic resin particle dispersion: “LIOSPHERE” RSP3015: 140.0 parts by weight
(f) Tetrahydrofuran: 1132.3 parts by weight
(g) “Isopar” M: 18.1 parts by weight The solid concentration of the heat sensitive layer composition solution was 13.8 wt %, and the content of the liquid having a solubility parameter of 17.0 $(MPa)^{1/2}$ or less and a boiling point in a range from 210 to 270° C. was 1.20 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 1.5 μm. Further, the occupying rate of the non-photosensitive particles at any horizontal plane was 20.0 area %. Furthermore, in 0.5 $\mu m^3$ of the heat sensitive layer in the portion where the non-photosensitive particles were not present, 41 liquid globules were observed, and the average diameter of the liquid globules was 0.15 μM. The liquid globules were analyzed, and the presence of a liquid derived from “Isopar” M and having a boiling point in a range from 223 to 254° C. was confirmed, and the amount of the liquid derived from “Isopar” M and generated as a gas was 14.61 μg.

The anti-blister maximum exposure value evaluated by the aforementioned method was 190 $mJ/cm^2$, and the solid print reproducing minimum exposure value was 150 $mJ/cm^2$, to show there was a latitude of 40 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 16

A directly imageable waterless lithographic printing plate precursor was obtained as described in Example 1, except that the heat sensitive layer composition solution −1 was changed to the following heat sensitive layer composition solution −16.

[Heat Sensitive Layer Composition Solution −16]

(a) “PROJET” 825LDI: 16.8 parts by weight
(b) “Nacem” Titan: 18.5 parts by weight
(c) “Sumilite Resin” PR50731: 125.9 parts by weight
(d) “Nippolan” 5196: 33.6 parts by weight
(e) Non-photosensitive crosslinked acrylic resin particle dispersion: “LIOSPHERE” RSP3015: 210.0 parts by weight
(f) Tetrahydrofuran: 1078.5 parts by weight
(g) “Isopar” M: 16.8 parts by weight The solid concentration of the heat sensitive layer composition solution was 13.9 wt %, and the content of the liquid having a solubility parameter of 17.0 $(MPa)^{1/2}$ or less and a boiling point in a range from 210 to 270° C. was 1.12 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 1.5 μm. Further, the occupying rate of the non-photosensitive particles at any horizontal plane was 30.0 area %. Furthermore, in 0.5 $\mu m^3$ of the heat sensitive layer in the portion where the non-photosensitive particles were not present, 39 liquid globules were observed, and the average diameter of the liquid globules was 0.16 μm. The liquid globules were analyzed, and the presence of a liquid derived from “Isopar” M and having a boiling point in a range from 223 to 254° C. was confirmed, and the amount of the liquid derived from “Isopar” M and generated as a gas was 13.57 μg.

The anti-blister maximum exposure value evaluated by the aforementioned method was 210 $mJ/cm^2$, and the solid print reproducing minimum exposure value was 170 $mJ/cm^2$, to show there was a latitude of 40 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 17

A directly imageable waterless lithographic printing plate precursor was obtained as described in Example 1, except that the heat sensitive layer composition solution −1 was changed to the following heat sensitive layer composition solution −17.

[Heat Sensitive Layer Composition Solution −17]
(a) "PROJET" 825LDI: 15.5 parts by weight
(b) "Nacem" Titan: 17.1 parts by weight
(c) "Sumilite Resin" PR50731: 116.3 parts by weight
(d) "Nippolan" 5196: 31.0 parts by weight
(e) Non-photosensitive crosslinked acrylic resin particle dispersion: "LIOSPHERE" RSP3015: 280.0 parts by weight
(f) Tetrahydrofuran: 1024.7 parts by weight
(g) "Isopar" M: 15.5 parts by weight The solid concentration of the heat sensitive layer composition solution was 14.0 wt %, and the content of the liquid having a solubility parameter of 17.0 $(MPa)^{1/2}$ or less and a boiling point in a range from 210 to 270° C. was 1.03 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 1.5 μm. Further, the occupying rate of the non-photosensitive particles at any horizontal plane was 40.0 area %. Furthermore, in 0.5 $\mu m^3$ of the heat sensitive layer in the portion where the non-photosensitive particles were not present, 40 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 12.54 μg.

The anti-blister maximum exposure value evaluated by the aforementioned method was 230 $mJ/cm^2$, and the solid print reproducing minimum exposure value was 190 $mJ/cm^2$, to show there was a latitude of 40 $mJ/cm^2$. The scumming of the non-image area was evaluated according to the aforementioned method, and partial scumming was observed in the print. The dispersion stability of the non-photosensitive particles in the heat sensitive layer composition solution was evaluated according to the aforementioned method, and the settlement of the non-photosensitive particles was not observed.

Example 18

A directly imageable waterless lithographic printing plate precursor was obtained as described in Example 1, except that the heat sensitive layer composition solution −1 was changed to the following heat sensitive layer composition solution −18.

[Heat Sensitive Layer Composition Solution −18]
(a) "PROJET" 825LDI: 20.0 parts by weight
(b) "Nacem" Titan: 22.0 parts by weight
(c) "Sumilite Resin" PR50731: 150.0 parts by weight
(d) "Nippolan" 5196: 40.0 parts by weight
(e) Non-photosensitive crosslinked acrylic resin particle dispersion: "Chemisnow" (registered trademark) MX150 (produced by Soken Chemical & Engineering Co., Ltd., average particle size 1.5 μm, CV value 9.0%, specific gravity 1.20, concentration 20 wt %, containing 80 wt % of methyl ethyl ketone as a dispersion medium): 37.5 parts by weight
(f) Tetrahydrofuran: 1210.5 parts by weight
(g) "Isopar" M: 20.0 parts by weight The solid concentration of the heat sensitive layer composition solution was 13.7 wt %, and the content of the liquid having a solubility parameter of 17.0 $(MPa)^{1/2}$ or less and a boiling point in a range from 210 to 270° C. was 1.33 wt %.

Evaluation was made as described in Example 1. The average particle size of the observed non-photosensitive particles in the cross sections of the heat sensitive layer was 1.5 μM, and the average layer thickness of the heat sensitive layer in the portion free from the non-photosensitive particles was 1.5 μm. Further, the occupying rate of the non-photosensitive particles at any horizontal plane was 5.0 area %. Furthermore, in 0.5 $\mu m^3$ of the heat sensitive layer in the portion where the non-photosensitive particles were not present, 41 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 16.19 μg.

The anti-blister maximum exposure value evaluated by the aforementioned method was 150 $mJ/cm^2$, and the solid print reproducing minimum exposure value was 120 $mJ/cm^2$, to show there was a latitude of 30 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 19

A directly imageable waterless lithographic printing plate precursor was obtained as described in Example 1, except that the heat sensitive layer composition solution −1 was changed to the following heat sensitive layer composition solution −19.

[Heat Sensitive Layer Composition Solution −19]
(a) "PROJET" 825LDI: 20.0 parts by weight
(b) "Nacem" Titan: 22.0 parts by weight
(c) "Sumilite Resin" PR50731: 150.0 parts by weight
(d) "Nippolan" 5196: 40.0 parts by weight
(e) Non-photosensitive crosslinked acrylic resin particle dispersion: "LIOSPHERE" RSP3031: 42.5 parts by weight
(f) Tetrahydrofuran: 1205.5 parts by weight
(g) "Isopar" M: 20.0 parts by weight The solid concentration of the heat sensitive layer composition solution was 13.8 wt %, and the content of the liquid having a solubility parameter of 17.0 $(MPa)^{1/2}$ or less and a boiling point in a range from 210 to 270° C. was 1.33 wt %.

Evaluation was made as described in Example 1. The average particle size of the observed non-photosensitive particles in the cross sections of the heat sensitive layer was 1.7 μm, and the average layer thickness of the heat sensitive layer in the portion free from the non-photosensitive particles was 1.5 μm. Further, the occupying rate of the non-photosensitive particles at any horizontal plane was 5.0 area %. Furthermore, in 0.5 $\mu m^3$ of the heat sensitive layer in the portion where the non-photosensitive particles were not present, 42 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 16.37 μg.

The anti-blister maximum exposure value evaluated by the aforementioned method was 150 mJ/cm$^2$, and the solid print reproducing minimum exposure value was 120 mJ/cm$^2$, to show there was a latitude of 30 mJ/cm$^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 20

A directly imageable waterless lithographic printing plate precursor was obtained as described in Example 1, except that the heat sensitive layer composition solution −1 was changed to the following heat sensitive layer composition solution −20.

[Heat Sensitive Layer Composition Solution −20]

(a) "PROJET" 825LDI: 26.7 parts by weight
(b) "Nacem" Titan: 29.3 parts by weight
(c) "Sumilite Resin" PR50731: 200.0 parts by weight
(d) "Nippolan" 5196: 53.3 parts by weight
(e) Non-photosensitive crosslinked acrylic resin particle dispersion: "LIOSPHERE" RSP3015: 35.0 parts by weight
(f) Tetrahydrofuran: 1129.0 parts by weight
(g) "Isopar" M: 26.7 parts by weight The solid concentration of the heat sensitive layer composition solution was 18.1 wt %, and the content of the liquid having a solubility parameter of 17.0 (MPa)$^{1/2}$ or less and a boiling point in a range from 210 to 270° C. was 1.78 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 2.0 μm. Further, the occupying rate of the non-photosensitive particles at any horizontal plane was 5.0 area %. Furthermore, in 0.5 μm$^3$ of the heat sensitive layer in the portion where the non-photosensitive particles were not present, 39 liquid globules were observed, and the average diameter of the liquid globules was 0.16 μm. The liquid globules were analyzed, and the presence of a liquid derived from "Isopar" M and having a boiling point in a range from 223 to 254° C. was confirmed, and the amount of the liquid derived from "Isopar" M and generated as a gas was 21.76 μg.

The anti-blister maximum exposure value evaluated by the aforementioned method was 130 mJ/cm$^2$, and the solid print reproducing minimum exposure value was 120 mJ/cm$^2$, to show there was a latitude of 10 mJ/cm$^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 21

A directly imageable waterless lithographic printing plate precursor was obtained as described in Example 1, except that the heat sensitive layer composition solution −1 was changed to the following heat sensitive layer composition solution −21.

[Heat Sensitive Layer Composition Solution −21]

(a) "PROJET" 825LDI: 26.7 parts by weight
(b) "Nacem" Titan: 29.3 parts by weight
(c) "Sumilite Resin" PR50731: 200.0 parts by weight
(d) "Nippolan" 5196: 53.3 parts by weight
(e) Non-photosensitive crosslinked acrylic resin particle dispersion: "LIOSPHERE" RSP3031: 42.5 parts by weight
(f) Tetrahydrofuran: 1121.5 parts by weight
(g) "Isopar" M: 26.7 parts by weight The solid concentration of the heat sensitive layer composition solution was 18.2 wt %, and the content of the liquid having a solubility parameter of 17.0 (MPa)$^{1/2}$ or less and a boiling point in a range from 210 to 270° C. was 1.78 wt %.

Evaluation was made as described in Example 1. The average particle size of the observed non-photosensitive particles in the cross sections of the heat sensitive layer was 1.7 μM, and the average layer thickness of the heat sensitive layer in the portion free from the non-photosensitive particles was 2.0 μm. Further, the occupying rate of the non-photosensitive particles at any horizontal plane was 5.0 area %. Furthermore, in 0.5 μm$^3$ of the heat sensitive layer in the portion where the non-photosensitive particles were not present, 43 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 21.88 μg.

The anti-blister maximum exposure value evaluated by the aforementioned method was 140 mJ/cm$^2$, and the solid print reproducing minimum exposure value was 120 mJ/cm$^2$, to show there was a latitude of 20 mJ/cm$^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Example 22

A directly imageable waterless lithographic printing plate precursor was obtained as described in Example 1, except that the heat sensitive layer composition solution −1 was changed to the following heat sensitive layer composition solution −22.

[Heat Sensitive Layer Composition Solution −22]

(a) "PROJET" 825LDI: 26.6 parts by weight
(b) "Nacem" Titan: 29.3 parts by weight
(c) "Sumilite Resin" PR50731: 199.5 parts by weight
(d) "Nippolan" 5196: 53.2 parts by weight
(e) Non-photosensitive crosslinked silicone particle dispersion: "Tospearl" (registered trademark) 120 (produced by Momentive Performance Materials, average particle size 2.0 μm, CV value 5.0%, specific gravity 1.32, concentration 20 wt %, containing 80 wt % of methyl ethyl ketone as a dispersion medium): 55.0 parts by weight
(f) Tetrahydrofuran: 1109.9 parts by weight
(g) "Isopar" M: 26.6 parts by weight The solid concentration of the heat sensitive layer composition solution was 18.3 wt %, and the content of the liquid having a solubility parameter of 17.0 (MPa)$^{1/2}$ or less and a boiling point in a range from 210 to 270° C. was 1.77 wt %.

Evaluation was made as described in Example 1. The average particle size of the observed non-photosensitive particles in the cross sections of the heat sensitive layer was 2.0 μm, and the average layer thickness of the heat sensitive layer in the portion free from the non-photosensitive particles was 2.0

μm. Further, the occupying rate of the non-photosensitive particles at any horizontal plane was 5.0 area %. Furthermore, in 0.5 $\mu m^3$ of the heat sensitive layer in the portion where the non-photosensitive particles were not present, 42 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 21.51 μg.

The anti-blister maximum exposure value evaluated by the aforementioned method was 150 $mJ/cm^2$, and the solid print reproducing minimum exposure value was 120 $mJ/cm^2$, to show there was a latitude of 30 $mJ/cm^2$. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Comparative Example 1

A directly imageable waterless lithographic printing plate precursor was obtained as described in Example 1, except that the heat sensitive layer composition solution −1 was changed to the following heat sensitive layer composition solution −23.

[Heat Sensitive Layer Composition Solution −23]

(a) "PROJET" 825LDI: 20.6 parts by weight
(b) "Nacem" Titan: 22.7 parts by weight
(c) "Sumilite Resin" PR50731: 154.8 parts by weight
(d) "Nippolan" 5196: 41.3 parts by weight
(e) Tetrahydrofuran: 1240.0 parts by weight
(g) "Isopar" M: 20.6 parts by weight The solid concentration of the heat sensitive layer composition solution was 13.6 wt %, and the content of the liquid having a solubility parameter of 17.0 $(MPa)^{1/2}$ or less and a boiling point in a range from 210 to 270° C. was 1.38 wt %.

Evaluation was made as described in Example 1. The non-photosensitive particles were not observed in the cross sections of the heat sensitive layer, and the average layer thickness of the heat sensitive layer was 1.5 μm. Further, in 0.5 $\mu m^3$ of the heat sensitive layer in the portion where the non-photosensitive particles were not present, 41 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 16.69 μg.

The anti-blister maximum exposure value evaluated by the aforementioned method was 120 $mJ/cm^2$, and the solid print reproducing minimum exposure value was 120 $mJ/cm^2$, to show there was no latitude. The scumming of the non-image area was evaluated according to the aforementioned method, and no scumming was observed in the print.

Comparative Example 2

A directly imageable waterless lithographic printing plate precursor was obtained as described in Example 1, except that the heat sensitive layer composition solution −1 was changed to the following heat sensitive layer composition solution −24.

[Heat Sensitive Layer Composition Solution −24]

(a) "PROJET" 825LDI: 20.4 parts by weight
(b) "Nacem" Titan: 22.4 parts by weight
(c) "Sumilite Resin" PR50731: 152.7 parts by weight
(d) "Nippolan" 5196: 40.7 parts by weight
(e) Non-photosensitive crosslinked acrylic resin particle dispersion: "LIOSPHERE" RSP3021: 15.0 parts by weight
(f) Tetrahydrofuran: 1228.4 parts by weight
(g) "Isopar" M: 20.4 parts by weight The solid concentration of the heat sensitive layer composition solution was 13.6 wt %, and the content of the liquid having a solubility parameter of 17.0 $(MPa)^{1/2}$ or less and a boiling point in a range from 210 to 270° C. was 1.36 wt %.

Evaluation was made as described in Example 1. The average particle size of the observed non-photosensitive particles in the cross sections of the heat sensitive layer was 0.6 μm, and the average layer thickness of the heat sensitive layer in the portion free from the non-photosensitive particles was 1.5 μm. Further, the occupying rate of the non-photosensitive particles at any horizontal plane was 5.0 area %. Furthermore, in 0.5 $\mu m^3$ of the heat sensitive layer in the portion where the non-photosensitive particles were not present, 38 liquid globules were observed, and the average diameter of the liquid globules was 0.16 μm. The liquid globules were analyzed, and the presence of a liquid derived from "Isopar" M and having a boiling point in a range from 223 to 254° C. was confirmed, and the amount of the liquid derived from "Isopar" M and generated as a gas was 16.47 μg.

The anti-blister maximum exposure value evaluated by the aforementioned method was 120 $mJ/cm^2$, and the solid print reproducing minimum exposure value was 120 $mJ/cm^2$, to show there was no latitude. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Comparative Example 3

A directly imageable waterless lithographic printing plate precursor was obtained as described in Example 1, except that the heat sensitive layer composition solution −1 was changed to the following heat sensitive layer composition solution −25.

[Heat Sensitive Layer Composition Solution −25]

(a) "PROJET" 825LDI: 47.5 parts by weight
(b) "Nacem" Titan: 52.3 parts by weight
(c) "Sumilite Resin" PR50731: 356.3 parts by weight
(d) "Nippolan" 5196: 95.0 parts by weight
(e) Non-photosensitive crosslinked acrylic resin particle dispersion: "LIOSPHERE" RSP3015: 35.0 parts by weight
(f) Tetrahydrofuran: 866.4 parts by weight
(g) "Isopar" M: 47.5 parts by weight The solid concentration of the heat sensitive layer composition solution was 31.8 wt %, and the content of the liquid having a solubility parameter of 17.0 $(MPa)^{1/2}$ or less and a boiling point in a range from 210 to 270° C. was 3.17 wt %.

Evaluation was made as described in Example 1. The average particle size of the observed non-photosensitive particles in the cross sections of the heat sensitive layer was 1.4 μm, and the average layer thickness of the heat sensitive layer in the portion free from the non-photosensitive particles was 3.5 μm. Further, the occupying rate of the non-photosensitive particles at any horizontal plane was 5.0 area %. Furthermore, in 0.5 $\mu m^3$ of the heat sensitive layer in the portion where the non-photosensitive particles were not present, 40 liquid globules were observed, and the average diameter of the liquid globules was 0.15 μm. The liquid globules were analyzed, and the presence of a liquid derived from "Isopar" M and having a boiling point in a range from 223 to 254° C. was confirmed, and the amount of the liquid derived from "Isopar" M and generated as a gas was 38.42 μg.

The anti-blister maximum exposure value evaluated by the aforementioned method was 120 mJ/cm$^2$, and the solid print reproducing minimum exposure value was 120 mJ/cm$^2$, to show there was no latitude. The scumming of the non-image area was evaluated according to the aforementioned method, and no scumming was observed in the print. The dispersion stability of the non-photosensitive particles in the heat sensitive layer composition solution was evaluated according to the aforementioned method, and the settlement of the non-photosensitive particles was not observed.

Evaluation results of Examples 1 to 22 and Comparative Examples 1 to 3 are shown in Table 1.

TABLE 1

| | Average layer thickness of heat sensitive layer (μm) | Non-photosensitive particles Material | Average particle size (μm) | CV value (%) | Occupying rate at any horizontal plane (area %) |
|---|---|---|---|---|---|
| Example 1 | 0.5 | Crosslinked acrylic resin particles | 0.6 | 18.9 | 5.0 |
| Example 2 | 0.5 | Crosslinked acrylic resin particles | 1.4 | 3.5 | 5.0 |
| Example 3 | 0.5 | Crosslinked acrylic resin particles | 1.7 | 2.9 | 5.0 |
| Example 4 | 0.5 | Crosslinked acrylic resin particles | 2.1 | 2.3 | 5.0 |
| Example 5 | 0.5 | Crosslinked acrylic resin particles | 2.6 | 1.9 | 5.0 |
| Example 6 | 1.0 | Silica particles | 1.1 | 3.6 | 5.0 |
| Example 7 | 1.0 | Crosslinked acrylic resin particles | 1.4 | 3.5 | 5.0 |
| Example 8 | 1.0 | Crosslinked acrylic resin particles | 1.7 | 2.9 | 5.0 |
| Example 9 | 1.2 | Crosslinked acrylic resin particles | 1.4 | 3.5 | 5.0 |
| Example 10 | 1.2 | Crosslinked acrylic resin particles | 1.7 | 2.9 | 5.0 |
| Example 11 | 1.5 | Crosslinked styrene resin particles | 1.3 | 5.0 | 5.0 |
| Example 12 | 1.5 | Crosslinked acrylic resin particles | 1.4 | 3.5 | 5.0 |
| Example 13 | 1.5 | Crosslinked acrylic resin particles | 1.4 | 3.5 | 1.0 |
| Example 14 | 1.5 | Crosslinked acrylic resin particles | 1.4 | 3.5 | 10.0 |
| Example 15 | 1.5 | Crosslinked acrylic resin particles | 1.4 | 3.5 | 20.0 |
| Example 16 | 1.5 | Crosslinked acrylic resin particles | 1.4 | 3.5 | 30.0 |
| Example 17 | 1.5 | Crosslinked acrylic resin particles | 1.4 | 3.5 | 40.0 |
| Example 18 | 1.5 | Crosslinked acrylic resin particles | 1.5 | 9.0 | 5.0 |
| Example 19 | 1.5 | Crosslinked acrylic resin particles | 1.7 | 2.9 | 5.0 |
| Example 20 | 2.0 | Crosslinked acrylic resin particles | 1.4 | 3.5 | 5.0 |
| Example 21 | 2.0 | Crosslinked acrylic resin particles | 1.7 | 2.9 | 5.0 |
| Example 22 | 2.0 | Crosslinked silicone particles | 2.0 | 5.0 | 5.0 |
| Comparative Example 1 | 1.5 | (Nil) | | | |
| Comparative Example 2 | 1.5 | Crosslinked acrylic resin particles | 0.6 | 18.9 | 5.0 |
| Comparative Example 3 | 3.5 | Crosslinked acrylic resin particles | 1.4 | 3.5 | 5.0 |

| | Anti-blister maximum exposure value (mJ/cm$^2$) | Solid print reproducing minimum exposure value (mJ/cm$^2$) | Latitude (mJ/cm$^2$) | Scumming of non-image area | Dispersion stability of non-photosensitive particles |
|---|---|---|---|---|---|
| Example 1 | 160 | 140 | 20 | ○ | ○ |
| Example 2 | 180 | 140 | 40 | ○ | ○ |
| Example 3 | 180 | 140 | 40 | ○ | ○ |
| Example 4 | 180 | 140 | 40 | ○ | ○ |
| Example 5 | 180 | 140 | 40 | X | ○ |
| Example 6 | 160 | 130 | 30 | ○ | X |
| Example 7 | 170 | 130 | 40 | ○ | ○ |
| Example 8 | 170 | 130 | 40 | ○ | ○ |
| Example 9 | 150 | 120 | 30 | ○ | ○ |
| Example 10 | 160 | 120 | 40 | ○ | ○ |
| Example 11 | 140 | 120 | 20 | ○ | ○ |
| Example 12 | 150 | 120 | 30 | ○ | ○ |
| Example 13 | 130 | 120 | 10 | ○ | ○ |
| Example 14 | 160 | 130 | 30 | ○ | ○ |
| Example 15 | 190 | 150 | 40 | ○ | ○ |
| Example 16 | 210 | 170 | 40 | ○ | ○ |
| Example 17 | 230 | 190 | 40 | Δ | ○ |
| Example 18 | 150 | 120 | 30 | ○ | ○ |
| Example 19 | 150 | 120 | 30 | ○ | ○ |
| Example 20 | 130 | 120 | 10 | ○ | ○ |
| Example 21 | 140 | 120 | 20 | ○ | ○ |
| Example 22 | 150 | 120 | 30 | ○ | ○ |
| Comparative Example 1 | 120 | 120 | 0 | ○ | |
| Comparative Example 2 | 120 | 120 | 0 | ○ | ○ |
| Comparative Example 3 | 120 | 120 | 0 | ○ | ○ |

INDUSTRIAL APPLICABILITY

The directly imageable waterless lithographic printing plate precursor of this invention can be used in the general printing area (commercial printing, newspaper printing, and printing on films, resin plates and non-absorbing materials such as metals). Further, it can be applied also in the display field including PDP and LCD, and also in the printable electronics field in which wiring patterns and the like are produced by a printing method.

The invention claimed is:

1. A directly imageable waterless lithographic printing plate precursor comprising at least a silicone rubber layer disposed on a heat sensitive layer which is disposed on a substrate in this order, wherein the heat sensitive layer contains non-photosensitive particles having an average particle size of not smaller than one half the average layer thickness of the portion of the heat sensitive layer where the non-photosensitive particles are not present, the non-photosensitive particles in the heat sensitive layer are present in any horizontal plane in an amount of 0.5 area % or larger, the heat sensitive layer is formed by coating a composition containing a polymer having active hydrogen, a crosslinking agent, and a photo thermal conversion material; or a composition containing a polymer having active hydrogen, an organic complex compound, and a photo thermal conversion material, the polymer having active hydrogen is a polymer having a structural unit with active hydrogen selected from the group consisting of —OH, —SH, —$NH_2$, —NH—, —CO—$NH_2$, —CO—NH—, —OC(=O)—NH—, —NH—CO—NH—, CO—OH, —CS—OH, —CO—SH, —CS—SH, —$SO_3H$, —$PO_3H_2$, —$SO_2$—$NH_2$, —$SO_2$—NH— and —CO—$CH_2$—CO—, the organic complex compound comprises a metal and an organic compound which functions as a crosslinking agent of the polymer having active hydrogen and/or as a catalyst for a thermosetting reaction, and the photo thermal conversion material is a pigment and/or a dye capable of absorbing infrared radiation or near infrared radiation.

2. A directly imageable waterless lithographic printing plate precursor, according to claim 1, wherein the non-photosensitive particles have a coefficient of variation (CV) value that is 15% or less.

3. A directly imageable waterless lithographic printing plate precursor, according to claim 1, wherein the non-photosensitive particles are spherical particles.

4. A directly imageable waterless lithographic printing plate precursor, according to claim 1, wherein the non-photosensitive particles are non-photosensitive organic particles.

5. A directly imageable waterless lithographic printing plate precursor, according to claim 4, wherein the non-photosensitive organic particles each have a crosslinked structure.

6. A directly imageable waterless lithographic printing plate precursor, according to claim 1, wherein the average particle size of the non-photosensitive particles is not larger than the average layer thickness of the total of: (1) the portion of the heat sensitive layer where the non-photosensitive particles are not present and (2) the silicone rubber layer.

7. A directly imageable waterless lithographic printing plate precursor, according to claim 6, wherein the CV value of the non-photosensitive particles is 15% or less, and wherein the non-photosensitive particles are spherical, organic particles having a crosslinked structure.

* * * * *